United States Patent
Clark

(10) Patent No.: US 7,531,452 B2
(45) Date of Patent: May 12, 2009

(54) STRAINED METAL SILICON NITRIDE FILMS AND METHOD OF FORMING

(75) Inventor: Robert D. Clark, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 143 days.

(21) Appl. No.: 11/730,343

(22) Filed: Mar. 30, 2007

(65) Prior Publication Data

US 2008/0242077 A1    Oct. 2, 2008

(51) Int. Cl.
  *H01L 21/44* (2006.01)
  *H01L 21/469* (2006.01)
  *H01L 21/31* (2006.01)

(52) U.S. Cl. .............. 438/656; 438/680; 438/758; 257/E21.161; 257/E21.17

(58) Field of Classification Search .......... 257/E21.161, 257/E21.17
See application file for complete search history.

(56) References Cited

U.S. PATENT DOCUMENTS

| | | | | |
|---|---|---|---|---|
| 6,569,501 | B2 * | 5/2003 | Chiang et al. | 427/535 |
| 7,314,835 | B2 * | 1/2008 | Ishizaka et al. | 438/758 |
| 7,338,901 | B2 * | 3/2008 | Ishizaka | 438/680 |
| 7,372,108 | B2 * | 5/2008 | Iinuma | 257/369 |
| 7,438,949 | B2 * | 10/2008 | Weidman | 427/250 |
| 2006/0162658 | A1 * | 7/2006 | Weidman | 118/715 |
| 2006/0165892 | A1 * | 7/2006 | Weidman | 427/248.1 |
| 2007/0065578 | A1 * | 3/2007 | McDougall | 427/248.1 |

* cited by examiner

*Primary Examiner*—Walter L Lindsay, Jr.
*Assistant Examiner*—Mohsen Ahmadi
(74) *Attorney, Agent, or Firm*—Oblon, Spivak, McClelland, Maier & Neustadt, P.C.

(57) ABSTRACT

A method for forming a strained metal nitride film and a semiconductor device containing the strained metal nitride film. The method includes exposing a substrate to a gas containing a metal precursor, exposing the substrate to a gas containing a silicon precursor, exposing the substrate to a gas containing a nitrogen precursor activated by a plasma source at a first level of plasma power and configured to react with the metal precursor or the silicon precursor with a first reactivity characteristic, and exposing the substrate to a gas containing the nitrogen precursor activated by the plasma source at a second level of plasma power different from the first level and configured to react with the metal precursor or the silicon precursor with a second reactivity characteristic such that a property of the metal silicon nitride film formed on the substrate changes to provide the strained metal silicon nitride film.

21 Claims, 20 Drawing Sheets

STRAINED METAL SILICON NITRIDE FILMS AND METHOD OF FORMING

CROSS-REFERENCE TO RELATED APPLICATIONS

This application is related to co-pending U.S. patent application Ser. No. 11/730,288. Publication No. US2008-0242116-A1, entitled "METHOD OF FORMING STRAINED SILICON NITRIDE FILMS AND A DEVICE CONTAINING SUCH FILMS," filed on even date herewith; co-pending U.S. patent application Ser. No. 11/730,342, Publication No. US2008-0241555-A1, entitled "STRAINED METAL NITRIDE FILMS AND METHOD OF FORMING, "filed on even date herewith; co-pending U.S. patent application Ser. No. 11/730,340. Publication No. US2008-0241382-A1, entitled "STRAINED METAL NITRIDE FILMS AND METHOD OF FORMING," filed on even date herewith; co-pending U.S. Pat. application Ser. No. 11/730,334. Publication No. US2008-0241388-A1, entitled "STRAINED METAL SILICON NITRIDE FILMS AND METHOD OF FORMING," filed on even date herewith; and co-pending U.S. patent application Ser. No. 11/529,380,Publication No. US2008-0081470-A1, entitled "A METHOD OF FORMING STRAINED SILICON NITRIDE FILMS AND A DEVICE CONTAINING SUCH FILMS," filed on Sep. 29, 2006. The entire contents of these applications are herein incorporated by reference in their entirety.

FIELD OF THE INVENTION

The present invention relates to semiconductor processing, and more particularly to methods of forming strained metal silicon nitride films and semiconductor devices containing these strained films.

BACKGROUND OF THE INVENTION

Nitride-based films are widely used in semiconductor devices and ultra-large-scale integrated (ULSI) circuits. For example, nitride films have been widely used in semiconductor devices as diffusion barriers for dopants and metals, as an etch-stop film during etching of fine features, as a final passivation film for encapsulation of fabricated devices, and as electrodes in capacitor and metal-oxide semiconductor field-effect transistor (MOSFET) structures, among many other uses. Nitride films can be deposited at low pressure or at atmospheric pressure using a variety of processing systems and process gases.

Recent innovations to improve complementary metal oxide semiconductor (CMOS) transistor performance have created an industry need for strained films that are compatible with current ULSI integration techniques. In particular, channel carrier mobility for negative metal oxide semiconductor (NMOS) transistors can be increased through introduction of tensile uniaxial or biaxial strain on a channel region of a MOS transistor. Typically, this has been accomplished by deposition of highly tensile strained silicon nitride films that are compatible with existing fabrication processes. With the advent of metal gate stacks, the strain imparted in the channel using stressed silicon nitride liner films over the MOSFET will be decreased due to the higher modulus of the metallic films. One proposed solution to this problem is to use stressed films within the gate stack, so that the stressed film is more proximate to the channel, thus increasing the imparted strain.

SUMMARY OF THE INVENTION

One embodiment of the invention includes a method of depositing a strained metal silicon nitride film on a substrate in a process chamber, including exposing the substrate to a gas including a metal precursor; exposing the substrate to a gas including a silicon precursor; and exposing the substrate to a gas including a nitrogen precursor activated by a plasma source at a first level of plasma power and configured to react with the metal precursor or the silicon precursor with a first reactivity characteristic. Also included is exposing the substrate to a gas including the nitrogen precursor activated by the plasma source at a second level of plasma power different from the first level and configured to react with the metal precursor or the silicon precursor with a second reactivity characteristic such that a property of the metal silicon nitride film formed on the substrate changes to provide the strained metal silicon nitride film.

According to another embodiment, the method includes a) exposing the substrate to a gas pulse including the metal precursor; b) exposing the substrate to a gas pulse including the nitrogen precursor activated by the plasma source at the first level of plasma power; and c) exposing the substrate to a gas pulse including the silicon precursor. Also included is exposing, the substrate to a gas pulse including the nitrogen precursor activated by the plasma source at the second level of plasma power; and e) repeating steps a)-d) a predetermined number of times.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1:
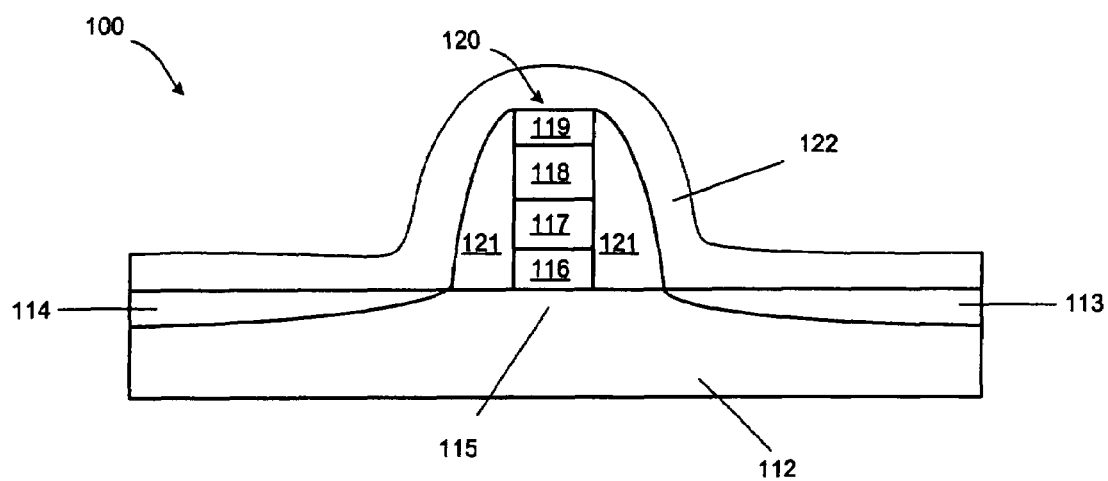
FIG. 1 schematically shows a cross-sectional view of a device containing a strained metal nitride or metal silicon nitride film according to embodiments of the invention.

Embodiments of the invention describe processing methods to deposit strained metal nitride and metal silicon nitride films with good thickness and uniformity control. In the case of metal nitride films, the processing methods utilize a metal precursor and one or more nitrogen precursors having a difference in reactivity towards the metal precursor, thereby depositing metal nitride films having a density gradient across the film thickness that creates tensile or compressive strain within the deposited film. In the case of metal silicon nitride films, the processing methods utilize a metal precursor, a silicon precursor, and one or more nitrogen precursors having a difference in reactivity towards the metal precursor or the silicon precursor.

According to one embodiment of the invention, a difference in heat of formation ($\Delta H$) of different nitrogen precursors may be utilized to achieve a difference in reactivity towards a metal precursor and/or a silicon precursor. $NH_3$ ($\Delta H=-45.9$ kJ/mol) and $N_2H_4$ ($\Delta H=95.35$ kJ/mol) are examples of nitrogen precursors with a large, difference in heat of formation. For example, using the same or similar processing conditions, a first metal nitride film portion deposited using $N_2H_4$ will have a different deposition rate and different film density than a second metal nitride film portion deposited using $NH_3$ onto the first metal nitride film portion. Variations in density across the thickness of an amorphous or crystalline film such as TiN will result in TiN film strain due to variations in coefficient of thermal expansion created across the TiN film. In the case of metal silicon nitride films, this difference in density may be further affected by altering the silicon precursor or the processing conditions during processing.

Alternately, a difference in reactivity may be achieved by varying plasma activation of a nitrogen precursor during processing. For example, the reactivity may be controlled by the type of plasma activation and the level of plasma power used for the activation. According to embodiments of the invention, plasma activation may be accomplished using a direct plasma source within the process chamber or using a remote plasma source.

In one example, embodiments of the invention may be utilized for forming a strained metal nitride or metal silicon nitride film located between materials with very different coefficients of thermal expansion, thereby increasing adhesion between the materials and decreasing the possibility of delamination during thermal cycling.

Embodiments of the invention may utilize atomic layer deposition (ALD), plasma enhanced ALD (PEALD), chemical vapor depositions (CVD), plasma enhanced CVD (PECVD), and pulsed CVD methods for depositing strained metal nitride and metal silicon nitride films. These deposition methods are well known methods for depositing a wide variety of materials. ALD is a CVD related film deposition method that uses sequential saturative surface reactions. In ALD, pulses of the gaseous precursors are alternately exposed to the substrate. In CVD, an uninterrupted flow of the gaseous precursors is exposed to the substrate, and in pulsed CVD, the flow of the gaseous precursors is periodically interrupted during the film deposition. In PEALD and PECVD, plasma excitation is utilized during at least a portion of the deposition process. The use of ALD, PEALD, CVD, PECVD, and pulsed CVD processing allows for varying the nitrogen precursor, ratio of nitrogen precursors, and/or processing conditions during the film deposition. In one example, the nitrogen precursor can be varied from $N_2H_4$ to a combination of $N_2H_4$ and $NH_3$, to pure $NH_3$, during CVD and pulsed CVD processing. In another example, the number of $N_2H_4$ gas pulses versus $NH_3$ gas pulses can be varied during ALD or PEALD processing. In another example, a level of plasma power used to activate the $N_2H_4$ or $NH_3$ gas can be varied during PEALD or PECVD processing. In yet another example, a dilution gas may be used in combination with plasma power to affect reactivity.

As used herein, metal nitride films refer to films containing a metal element (or multiple metal elements) and nitrogen (N) as the major elements, where the elemental composition of the metal nitride films can be varied over wide ranges of atomic concentrations for the metal or metals and N. Metal silicon nitride films refer to films containing a metal element (or multiple metal elements), silicon (Si) and nitrogen (N) as the major elements, where the elemental composition of the metal silicon nitride films can be varied over wide ranges of atomic concentrations for the metal or metals, Si and/or N. Furthermore, the metal nitride and metal silicon nitride films may contain impurities such as carbon (C), oxygen (O), halogen (e.g., chlorine (Cl)), and hydrogen (H), that may become incorporated into the films during the substrate processing or during substrate transfer. The terms "film" and "layer" are used interchangeably herein to refer to a material deposited or formed on a substrate.

Referring now to the drawings, FIG. 1 schematically shows a cross-sectional view of a device containing a strained metal nitride or metal silicon nitride film according to an embodiment of the invention. The strained nitride film 118 is disposed in a MOS device 100. The device 100, as shown, includes a substrate 112 having doped regions 113 and 114 (e.g., source and drain), a gate stack 120, a spacer 121, and a liner 122. The substrate 112 can for example be a Si, Ge, Si/Ge, or GaAs substrate wafer. The substrate 112 can be of any size, for example, a 200 mm substrate, a 300 mm substrate, or an even larger substrate.

The gate stack 120 includes a dielectric film 116 on the channel region 115. The dielectric layer 116 can for example include a $SiO_2$ layer, a SiN layer, a SiON layer, or a combination thereof, or any other appropriate dielectric-material. The dielectric film 116 can further include a high-dielectric constant (high-k) dielectric material. The high-k dielectric material can for example include metal oxides and their silicates, including $Ta_2O_5$, $TiO_2$, $ZrO_2$, $Al_2O_3$, $Y_2O_3$, $HfO_xN_y$, $HfSiO_xN_y$, $HfSiO_x$, $HfO_2$, $ZrO_2$, $ZrSiO_x$, $ZrO_xN_y$, $ZrSiO_xN_y$, $TaSiO_x$, $SrO_x$, $SrSiO_x$, $LaO_x$, $LaSiO_x$, $YO_x$, $YSiO_x$, or BaO, or combinations of two or more thereof.

In one embodiment of the invention, a conductive film 117 (e.g., a gate electrode film) is formed on the dielectric film 116, and a strained metal nitride film or metal silicon nitride film 118 is formed on the conductive film 117 to impart strain to the channel region 115. A cap layer 119 can be positioned at the top of the gate stack 120 to protect the gate stack 120 and improve electrical contact to the gate stack 120. The cap layer 119 can, for example, include one or more of a SiN layer, a W layer, a $WSi_x$ layer, a $CoSi_x$ layer, a $NiSi_x$ layer or a polycrystalline or amorphous Si layer.

In one example, the conductive layer 117 can be tantalum nitride (TaN), and the strained metal nitride film 118 can contain titanium nitride (TiN). The gate stack 120 may include different and fewer or more films or layers than shown in FIG. 1. In one example, film 117 and film 118 may be composed of the same metal nitride or metal silicon nitride film with a vertical density gradient formed according to embodiments of the invention. FIG. 1 further shows that spacer 121 is formed on either side of the gate stack 120 in order to protect the gate stack 120 from damage and ensure electrical performance of the gate. In addition, the spacer 121 can be used as a hard mask for the formation of the source and drain 113, 114 of the MOS device 100. Alternately, in one embodiment, more than one spacer 121 may be used.

In one embodiment, the device 100 can be a NMOS device where the strained metal nitride or metal silicon nitride film 118 increases channel carrier mobility through introduction of a tensile stress on the channel region 115. The strained nitride film 118 can also serve as a conductive film for improving electrical contact to the device 100.

In another embodiment, the device 100 can be a PMOS device where the strained metal nitride film 118 increases channel carrier mobility through introduction of a compressive stress on the channel region 115, thus enhancing transistor mobilities and hence overall transistor performance. The strained metal nitride film 118 can also serve as a conductive film for improving electrical contact to the device 100.

Figure 2A:
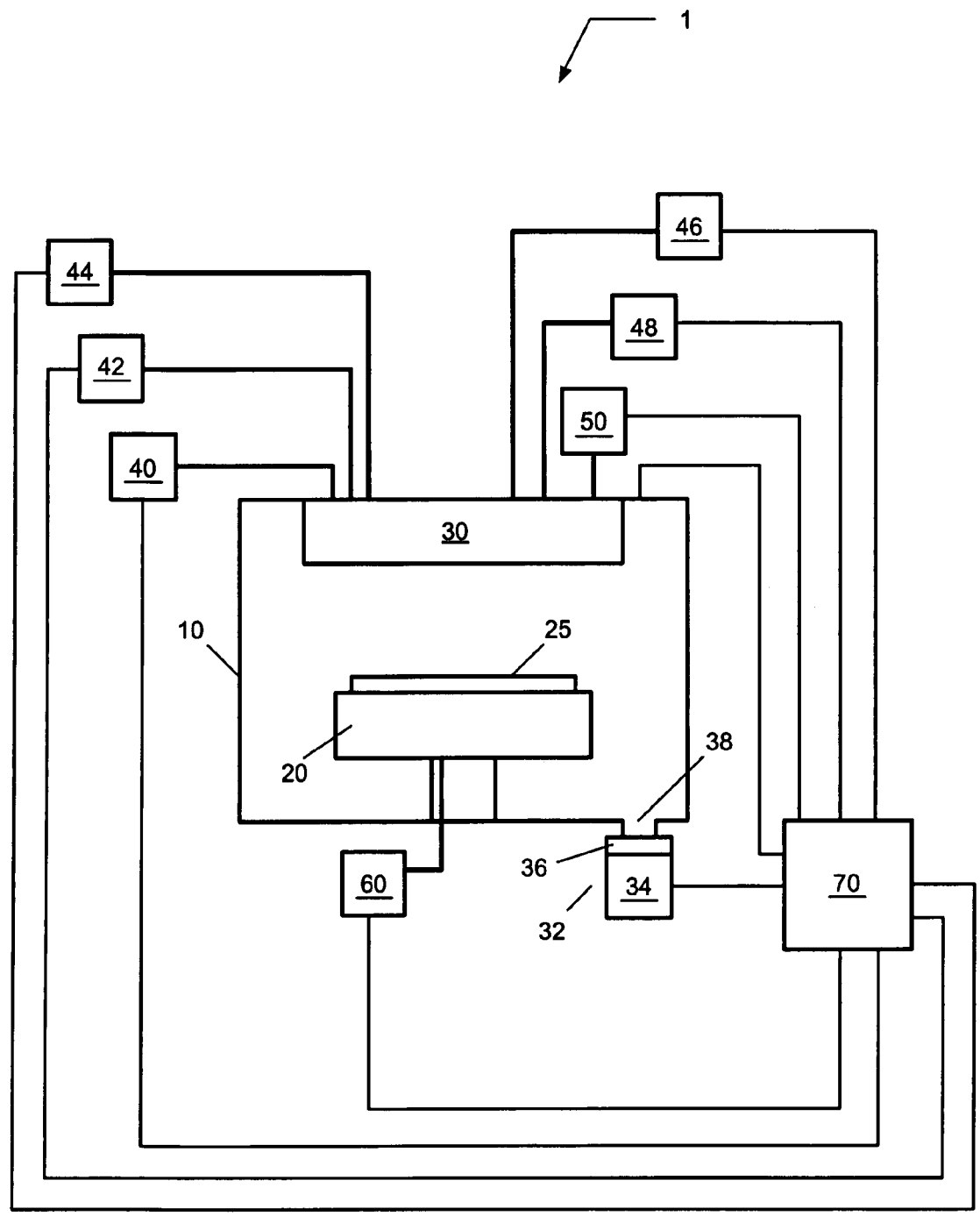
FIGS. 2A-2B illustrate processing systems for forming strained metal nitride or metal silicon nitride films according to embodiments of the invention.

FIG. 2A illustrates a processing system 1 for forming strained metal nitride and/or metal silicon nitride films according to embodiments of the invention. The processing system 1 can be configured to perform an ALD process, a CVD process, or a pulsed CVD process. The processing system 1 includes a process chamber 10 having a substrate holder 20 configured to support a substrate 25, upon which the strained film is formed. The process chamber 10 further contains an upper assembly 30 (e.g., a showerhead) configured for introducing process gases into the process chamber 10, a metal precursor supply system 40, a first nitrogen precursor supply system 42, a second nitrogen precursor supply system 44, a silicon precursor supply system 46, a purge gas supply system 48, and an auxiliary gas supply system 50. Furthermore, the processing system 1 includes a substrate temperature control system 60 coupled to substrate holder 20 and configured to elevate and control the temperature of the substrate 25.

In FIG. 2A, singular processing elements (10, 20, 30, 40, 42, 44, 46, 48, 50, and 60) are shown, but this is not required for the invention. The processing system 1 can include any number of processing elements having any number of controllers associated with them in addition to independent processing elements. The controller 70 can be used to configure any number of processing elements. (10, 20, 30, 40, 42, 44, 46, 48, 50, and 60), and the controller 70 can collect, provide, process, store, and display data from the processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 2A, the processing system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto. Alternately, a batch processing system capable of processing multiple substrates simultaneously may be utilized for depositing the strained films described in the embodiments of the invention.

Still referring to FIG. 2A, the purge gas supply system 48 is configured to introduce a purge gas to process chamber 10. For example, the introduction of purge gas may occur between introduction of pulses of a metal precursor, a silicon precursor, a first nitrogen precursor, and a second nitrogen precursor gas to the process chamber 10. The purge gas can comprise an inert gas, such as a noble gas (i.e., He, Ne, Ar, Kr, Xe), nitrogen ($N_2$), or hydrogen ($H_2$).

The substrate temperature control system 60 contains temperature control elements, such as a cooling system including a re-circulating coolant flow that receives heat from substrate holder 20 and transfers heat to a heat exchanger system (not shown), or when heating, transfers heat from the heat exchanger system to the substrate holder. Additionally, the temperature control elements can include heating/cooling elements, such as resistive heating elements, or thermoelectric heaters/coolers, which can be included in the substrate holder 20, as well as the chamber wall of the process chamber 10 and any other component within the processing system 1. The substrate temperature control system 60 can, for example, be configured to elevate and control the substrate temperature from room temperature to approximately 600° C., or higher. In another example, the substrate temperature can, for example, range from approximately 150° C. to 350° C. It is to be understood, however, that the temperature of the substrate is selected based on the desired temperature for causing deposition of a particular nitride film on the surface of a given substrate.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas (e.g., helium (He)) to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein He gas-gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the nitride film on substrate 25, and suitable for use of the precursor gases. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the process chamber 10. The pressure control system 32 can, for example, be configured to control the process chamber pressure between about 0.1 Torr and about 100 Torr during deposition of the strained films. For example, the process chamber pressure can be between about 0.1 Torr and about 10 Torr, or between about 0.2 Torr and about 3 Torr.

The metal precursor supply system 40, first nitrogen precursor supply system 42, second nitrogen precursor gas supply system 44, silicon precursor supply system 46, a purge gas supply system 48, and auxiliary gas supply system 50 can include one or more pressure control devices, one or more flow control devices, one or more filters, one or more valves, and/or one or more flow sensors. The flow control devices can include pneumatic driven valves, electromechanical (solenoidal) valves, and/or high-rate pulsed gas injection valves. According to embodiments of the invention, gases may be sequentially and alternately pulsed into the process chamber 10. An exemplary pulsed gas injection system is described in greater detail in pending U.S. Patent Application Publication No. 2004/0123803.

In exemplary ALD and PEALD processes, the length of each gas pulse can, for example, be between about 0.1 sec and about 100 sec. Alternately, the length of each gas pulse can be between about 1 sec and about 10 sec. Exemplary gas pulse lengths for metal precursors can be between 0.3 and 3 sec, for example 1 sec. Exemplary gas pulse lengths for a nitrogen precursor and a silicon precursor can be between 0.1 and 3 sec, for example 0.3 sec. Exemplary purge gas pulses can be between 1 and 20 sec, for example 3 sec.

Still referring to FIG. 2A, controller 70 can comprise a microprocessor, memory, and a digital I/O port capable of generating control voltages sufficient to communicate and activate inputs to the processing system 1 as well as monitor outputs from the processing system 1. Moreover, the controller 70 may be coupled to and may exchange information with the process chamber 10, substrate holder 20, upper assembly 30, metal precursor supply system 40, first nitrogen precursor supply system 42, second nitrogen precursor gas supply system 44, silicon precursor supply system 46, purge gas supply system 48, auxiliary gas supply system 50, substrate temperature control system 60, and pressure control system 32. For example, a program stored in the memory may be utilized to activate the inputs to the aforementioned components of the processing system 1 according to a process recipe in order to perform a deposition process. One example of the controller 70 is a DELL PRECISION WORKSTATION 610™, available from Dell Corporation, Austin, Tex.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software. The controller 70 can be coupled to one or more additional controllers/computers (not shown), and controller 70 can obtain setup and/or configuration information from an additional controller/computer.

The controller 70 includes at least one computer readable medium or memory, such as the controller memory, for holding instructions programmed according to the teachings of the invention and for containing data structures, tables, records, or other data that may be necessary to implement, the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the processing system 1 via a wireless connection.

Figure 2B:
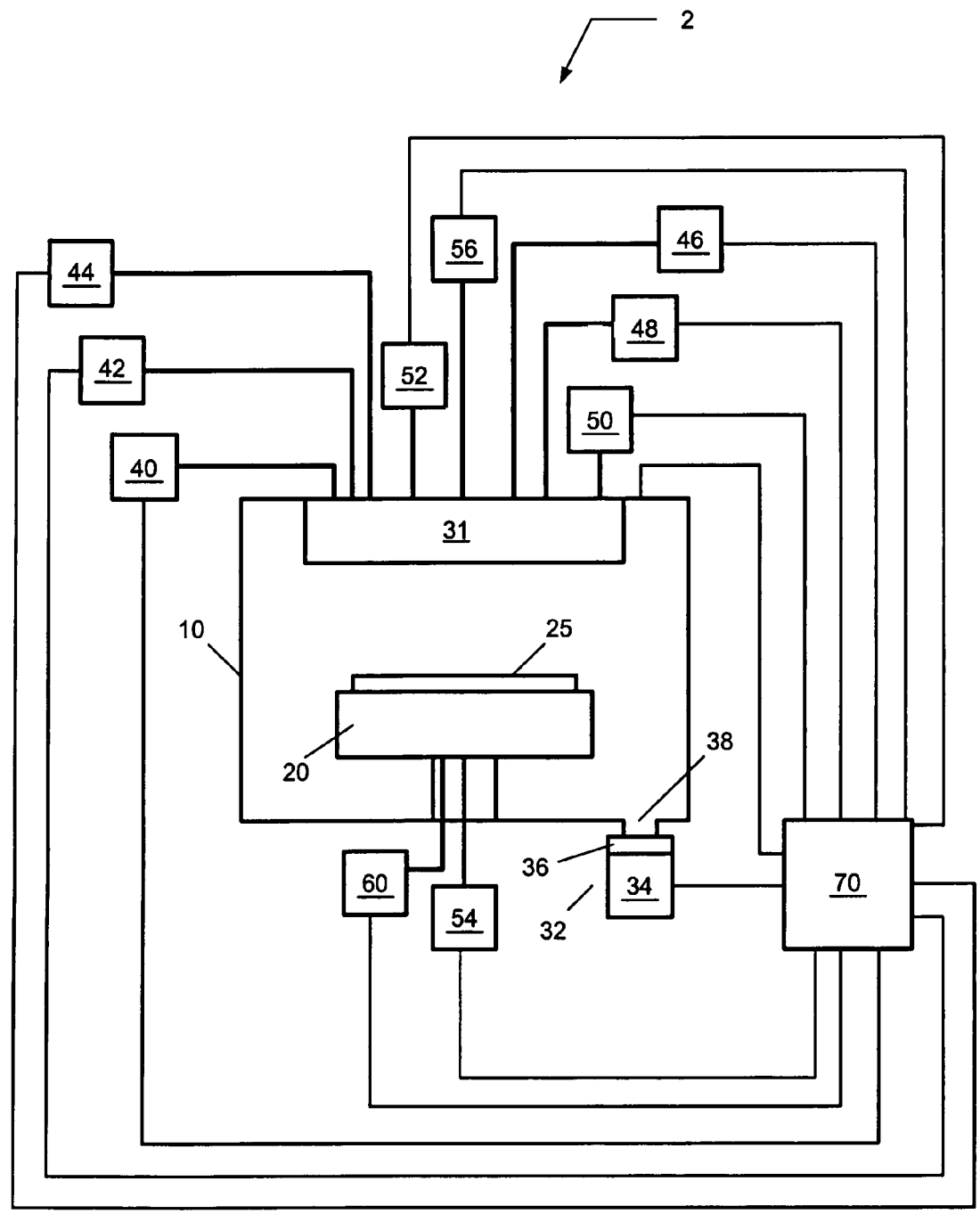

FIG. 2B illustrates a processing system 2 for forming strained metal nitride and/or metal silicon nitride films according to embodiments of the invention. The processing system 2 can be configured to perform an PEALD or a PECVD process. The processing system 2 is similar to the processing system 1 described in FIG. 2A, but further includes a plasma generation system configured to generate a plasma during at least a portion of the gas exposures in the process chamber 10. According to one embodiment of the invention, plasma excited nitrogen may be formed from a nitrogen-containing gas containing $N_2$, $NH_3$, or $N_2H_4$, or $C_1$-$C_{10}$ alkylhydrazine compounds, or a combination thereof.

The plasma generation system includes a first power source 52 coupled to the process chamber 10, and configured to couple power to gases introduced into the process chamber 10. The first power source 52 may be a variable power source and may include a radio frequency (RF) generator and an impedance match network, and may further include an electrode through which RF power is coupled to the plasma in process chamber 10. The electrode can be formed in the upper assembly 31, and it can be configured to oppose the substrate holder 20. The impedance match network can be configured to optimize the transfer of RF power from the RF generator to the plasma by matching the output impedance of the match network with the input impedance of the process chamber 10, including the electrode, and plasma. For instance, the impedance match network serves to improve the transfer of RF power to plasma in process chamber 10 by reducing the reflected power. Match network topologies (e.g. L-type, π-type, T-type, etc.) and automatic control methods are well known to those skilled in the art.

Alternatively, the first power source 52 may include a RF generator and an impedance match network, and may further include an antenna, such as an inductive coil, through which RF power is coupled to a plasma in process chamber 10. The antenna can, for example, include a helical or solenoidal coil, such as in an inductively coupled plasma source or helicon source, or it can, for example, include a flat coil as in a transformer coupled plasma source.

Still alternatively, the first power source 52 may include a microwave frequency generator, and may further include a microwave antenna and microwave window through which microwave power is coupled to a plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, the entire content of which is incorporated herein by reference.

According to one embodiment of the invention, the processing system 2 includes a substrate bias generation system configured to generate or assist in generating a plasma (through biasing of substrate holder 20) during at least a portion of the alternating introduction of the gases to the process chamber 10. The substrate bias system can include a substrate power source 54 coupled to the process chamber 10, and configured to couple power to the substrate 25. The substrate power source 54 may include a RF generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 2B as separate entities, they may indeed comprise one or more power sources coupled to substrate holder 20.

In addition, the processing system 2 includes a remote plasma system 56 for providing and remotely plasma exciting a gas (e.g., a nitrogen precursor) prior to flowing the plasma excited gas into the process chamber 10 where it is exposed to the substrate 25. The remote plasma system 56 can, for example, contain a microwave frequency generator.

Examples of metal precursors, silicon precursors, and nitrogen precursors that may be utilized in embodiments of the invention to deposit strained metal nitride and metal silicon nitride films will now be described. As those skilled in the art will readily recognize, other metal precursors, silicon precursors, and nitrogen precursors not described below, but suitable for film deposition, may be utilized.

Embodiments of the invention may use metal precursors selected from the groups of volatile metal precursors suitable for depositing stable metal nitride or metal silicon nitride films. The metal precursor can, for example contain a metal element selected from alkaline earth elements, rare earth elements, Group III, Group IIIB, Group IVB, Group VB, and Group VIB of the Periodic Table, or a combination of two or more thereof.

Embodiments of the invention may utilize a wide variety of different alkaline earth precursors. For example, many alkaline earth precursors have the formula:

$$ML^1L^2D_x$$

where M is an alkaline earth metal element selected from the group of beryllium (Be), magnesium (Mg), calcium (Ca), strontium (Sr), and barium (Ba). $L^1$ and $L^2$ are individual anionic ligands, and D is a neutral donor ligand where x can be 0, 1, 2, or 3. Each $L^1$, $L^2$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Examples of L group alkoxides include tert-butoxide, isopropoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclepentadienyls include cyclopentadienyl, 1-methylcyclopentadienyl, 1,2,3,4-tetramethylcyclopentadienyl, 1-ethylcyclopentadienyl, pentamethylcyclopentadienyl, 1-isopropylcyclopentadienyl, 1-n-propylcyclopentadienyl, and 1-n-butylcyclopentadienyl. Examples of alkyls include bis(trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentanedionate (hfac), and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6, 10-Crown-4, pyridine, N-methylpyrolidine, triethylamine, trimethylamine, acetonitrile, and 2,2-dimethylpropionitrile.

Representative examples of alkaline earth precursors include:

Be precursors: Be(N(SiMe$_3$)$_2$)$_2$, Be(TMPD)$_2$, and BeEt$_2$.

Mg precursors: Mg(N(SiMe$_3$)$_2$)$_2$, Mg(TMPD)$_2$, Mg(PrCp)$_2$, Mg(EtCp)$_2$, and MgCp$_2$.

Ca precursors: Ca(N(SiMe$_3$)$_2$)$_2$, Ca(iPr$_4$Cp)$_2$, and Ca(Me$_5$Cp)$_2$.

Sr precursors: Bis(tert-butylacetamidinato)strontium (TBAASr), Sr(N(SiMe$_3$)$_2$)$_2$, Sr(THD)$_2$, Sr(THD)$_2$(tetraglyme), Sr(iPr$_4$Cp)$_2$, Sr(iPr$_3$Cp)$_2$, and Sr(Me$_5$Cp)$_2$.

Ba precursors: Bis(tert-butylacetamidinato)barium (TBAABa), Ba(N(SiMe$_3$)$_2$)$_2$, Ba(THD)$_2$, Ba(THD)$_2$(tetraglyme), Ba(iPr$_4$Cp)$_2$, Ba(Me$_5$Cp)$_2$, and Ba(nPrMe$_4$Cp)$_2$.

Representative examples of Group IVB precursors include: Hf(OtBu)$_4$ (hafnium tert-butoxide, HTB), Hf(NEt$_2$)$_4$ (tetrakis(diethylamido)hafnium, TDEAH), Hf(NEtMe)$_4$ (tetrakis(ethylmethylamido)hafnium, TEMAH), Hf(NMe$_2$)$_4$ (tetrakis(dimethylamido)hafnium, TDMAH), Zr(OtBu)$_4$ (zirconium tert-butoxide, ZTB), Zr(NEt$_2$)$_4$ (tetrakis(diethylamido)zirconium, TDEAZ), Zr(NMeEt)$_4$ (tetrakis(ethylmethylamido)zirconium, TEMAZ), Zr(NMe$_2$)$_4$ (tetrakis(dimethylamido)zirconium, TDMAZ), Hf(mmp)$_4$, Zr(mmp)$_4$, Ti(mmp)$_4$, HfCl$_4$, ZrCl$_4$, TiCl$_4$, Ti(NiPr$_2$)$_4$, Ti(NiPr$_2$)$_3$, tris (N,N'-dimethylacetamidinato)titanium, ZrCp$_2$Me$_2$, Zr(tBuCp)$_2$Me$_2$, Zr(NiPr$_2$)$_4$, Ti(OiPr)$_4$, Ti(OtBu)$_4$ (titanium tert-butoxide, TTB), Ti(NEt$_2$)$_4$ (tetrakis(diethylamido)titanium, TDEAT), Ti(NMeEt)$_4$ (tetrakis(ethylmethylamido)titanium, TEMAT), Ti(NMe$_2$)$_4$ (tetrakis(dimethylamido)titanium, TDMAT), and Ti(THD)$_3$ (tris(2,2,6,6-tetramethyl-3,5-heptanedionato)titanium).

Representative examples of Group VB precursors include: Ta(NMe$_2$)$_5$ (pentakis(dimethylamido)tantalum, PDMAT), Ta(NEtMe)$_5$ (pentakis(ethylmethylamido)tantalum, PEMAT), (tBuN)Ta(NMe$_2$)$_3$ (tert-butylimido tris(dimethylamido)tantalum, TBTDMT), (tBuN)Ta(NEt$_2$)$_3$ (tert-butylimido tris(diethylamido)tantalum, TBTDET), (tBuN)Ta(NEtMe)$_3$ (tert-butylimido tris(ethylmethylamido)tantalum, TBTEMT), (EtMe$_2$CN)Ta(NMe$_2$)$_3$ (tert-amylimido tris(dimethylamido)tantalum, TAIMATA), (iPrN)Ta(NEt$_2$)$_3$ (iso-propylimino tris(diethylamido)tantalum, IPTDET), Ta$_2$(OEt)$_{10}$ (tantalum penta-ethoxide, TAETO), (Me$_2$NCH$_2$CH$_2$O)Ta(OEt)$_4$ (dimethylaminoethoxy tantalum tetra-ethoxide, TATDMAE), TaCl$_5$ (tantalum penta-chloride), Nb(NMe$_2$)$_5$ (pentakis(dimethylamido)niobium, PDMANb), Nb$_2$(OEt)$_{10}$ (niobium penta-ethoxide, NbETO), (tBuN)Nb(NEt$_2$)$_3$ (tert-butylimino tris(diethylamido)niobium, TBTDEN), and NbCl$_5$ (niobium penta-chloride).

Representative examples of Group VIB precursors include: Cr(CO)$_6$ (chromium hexacarbonyl), Mo(CO)$_6$ (molybdenum hexacarbonyl), W(CO)$_6$ (tungsten hexacarbonyl), WF$_6$ (tungsten hexafluoride), and (tBuN)$_2$W(NMe$_2$)$_2$ (bis(tert-butylimido)bis(dimethylamido)tungsten, BTBMW).

Embodiments of the inventions may utilize a wide variety of different rare earth precursors. For example, many rare earth precursors have the formula:

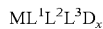

where M is a rare earth metal element selected from the group of scandium (Sc), yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). $L^1$, $L^2$, $L^3$ are individual anionic ligands, and D is a neutral donor ligand where x can be 0, 1, 2, or 3. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Examples of, L groups and D ligands are identical to those presented above for the alkaline earth precursor formula.

Representative, examples of rare earth precursors include:

Y precursors: Y(N(SiMe$_3$)$_2$)$_3$, Y(N(iPr)$_2$)$_3$, Y(N(tBu)SiMe$_3$)$_3$, Y(TMPD)$_3$, Cp$_3$Y, (MeCp)$_3$Y, ((nPr)Cp)$_3$Y, ((nBu)Cp)$_3$Y, Y(OCMe$_2$CH$_2$NMe$_2$)$_3$, Y(THD)$_3$, Y[OOCCH(C$_2$H$_5$)C$_4$H$_9$]$_3$, Y(C$_{11}$H$_{19}$O$_2$)$_3$CH$_3$(OCH$_2$CH$_2$)$_3$OCH$_3$, Y(CF$_3$COCHCOCF$_3$)$_3$, Y(OOCC$_{10}$H$_7$)$_3$, Y(OOC$_{10}$H$_{19}$)$_3$, and Y(O(iPr))$_3$.

La precursors: La(N(SiMe$_3$)$_2$)$_3$, La(N(iPr)$_2$)$_3$, La(N(tBu)SiMe$_3$)$_3$, La(TMPD)$_3$, ((iPr)Cp)$_3$La, Cp$_3$La, Cp$_3$La(NCCH$_3$)$_2$, La(Me$_2$NC$_2$H$_4$Cp)$_3$, La(THD)$_3$, La[OOCCH(C$_2$H$_5$)C$_4$H$_9$]$_3$, La(C$_{11}$H$_{19}$O$_2$)$_3$.CH$_3$(OCH$_2$CH$_2$)$_3$OCH$_3$, La(C$_{11}$H$_{19}$O$_2$)$_3$.CH$_3$(OCH$_2$CH$_2$)$_4$OCH$_3$, La(O(iPr))$_3$, La(OEt)$_3$, La(acac)$_3$, La(((tBu)$_2$N)$_2$CMe)$_3$, La(((iPr)$_2$N)$_2$CMe)$_3$, La(((tBu)$_2$N)$_2$C(tBu))$_3$, La(((iPr)$_2$N)$_2$C(tBu))$_3$, and La(FOD)$_3$.

Ce precursors: Ce(N(SiMe$_3$)$_2$)$_3$, Ce(N(iPr)$_2$)$_3$, Ce(N(tBu)SiMe$_3$)$_3$, Ce(TMPD)$_3$, Ce(FOD)$_3$, ((iPr)Cp)$_3$Ce, Cp$_3$Ce, Ce(Me$_4$Cp)$_3$, Ce(OCMe$_2$CH$_2$NMe$_2$)$_3$, Ce(THD)$_3$, Ce[OOCCH(C$_2$H$_5$)C$_4$H$_9$]$_3$, Ce(C$_{11}$H$_{19}$O$_2$)$_3$.CH$_3$(OCH$_2$CH$_2$)$_3$OCH$_3$, Ce(C$_{11}$H$_{19}$O$_2$)$_3$.CH$_3$(OCH$_2$CH$_2$)$_4$OCH$_3$, Ce(O(iPr))$_3$, and Ce(acac)$_3$.

Pr precursors: Pr(N(SiMe$_3$)$_2$)$_3$, ((iPr)Cp)$_3$Pr, Cp$_3$Pr, Pr(THD)$_3$, Pr(FOD)$_3$, (C$_5$Me$_4$H)$_3$Pr, Pr[OOCCH(C$_2$H$_5$)C$_4$H$_9$]$_3$, Pr(C$_{11}$H$_{19}$O$_2$)$_3$.CH$_3$(OCH$_2$CH$_2$)$_3$OCH$_3$, Pr(O(iPr))$_3$, Pr(acac)$_3$, Pr(hfac)$_3$, Pr(((tBu)$_2$N)$_2$CMe)$_3$, Pr(((iPr)$_2$N)$_2$CMe)$_3$, Pr(((tBu)$_2$N)$_2$C(tBu))$_3$, and Pr(((iPr)$_2$N)$_2$C(tBu))$_3$.

Nd precursors: Nd(N(SiMe$_3$)$_2$)$_3$, Nd(N(iPr)$_2$)$_3$, ((iPr)Cp)$_3$Nd, Cp$_3$Nd, (C$_5$Me$_4$H)$_3$Nd, Nd(THD)$_3$, Nd[OOCCH(C$_2$H$_5$)C$_4$H$_9$]$_3$, Nd(O(iPr))$_3$, Nd(acac)$_3$, Nd(hfac)$_3$, Nd(F$_3$CC(O)CHC(O)CH$_3$)$_3$, and Nd(FOD)$_3$.

Sm precursors: Sm(N(SiMe$_3$)$_2$)$_3$, ((iPr)Cp)$_3$Sm, Cp$_3$Sm, Sm(THD)$_3$, Sm[OOCCH(C$_2$H$_5$)C$_4$H$_9$]$_3$, Sm(O(iPr))$_3$, Sm(acac)$_3$, and (C$_5$Me$_5$)$_2$Sm.

Eu precursors: Eu(N(SiMe$_3$)$_2$)$_3$, ((iPr)Cp)$_3$Eu, Cp$_3$Eu, (Me$_4$Cp)$_3$Eu, Eu(THD)$_3$, Eu[OOCCH(C$_2$H$_5$)C$_4$H$_9$]$_3$, Eu(O(iPr))$_3$, Eu(acac)$_3$, and (C$_5$Me$_5$)$_2$Eu.

Gd precursors: Gd(N(SiMe$_3$)$_2$)$_3$, ((iPr)Cp)$_3$Gd, Cp$_3$Gd, Gdd(THD)$_3$, Gd[OOCCH(C$_2$H$_5$)C$_4$H$_9$]$_3$, Gd(O(iPr))$_3$, and Gd(acac)$_3$.

Tb precursors: Tb(N(SiMe$_3$)$_2$)$_3$, ((iPr)Cp)$_3$Tb, Cp$_3$Tb, Tb(THD)$_3$, Tb[OOCCH(C$_2$H$_5$)C$_4$H$_9$]$_3$, Tb(O(iPr))$_3$, and Tb(acac)$_3$.

Dy precursors: Dy(N(SiMe$_3$)$_2$)$_3$, ((iPr)CP)$_3$Dy, Cp$_3$Dy, Dy(THD)$_3$, Dy[OOCCH(C$_2$H$_5$)C$_4$H$_9$]$_3$, Dy(O(iPr))$_3$, Dy(O$_2$C(CH$_2$)$_6$CH$_3$)$_3$, and Dy(acac)$_3$.

Ho precursors: Ho(N(SiMe$_3$)$_2$)$_3$, ((iPr)Cp)$_3$Ho, Cp$_3$Ho, Ho(THD)$_3$, Ho[OOCCH(C$_2$H$_5$)C$_4$H$_9$]$_3$, Ho(O(iPr))$_3$, and Ho(acac)$_3$.

Er precursors: Er(N(SiMe$_3$)$_2$)$_3$, ((iPr)Cp)$_3$Er, ((nBu)Cp)$_3$Er, Cp$_3$Er, Er(THD)$_3$, Er[OOCCH(C$_2$H$_5$)C$_4$H$_9$]$_3$, Er(O(iPr))$_3$, and Er(acac)$_3$.

Tm precursors: Tm(N(SiMe$_3$)$_2$)$_3$, ((iPr)Cp)$_3$Tm, Cp$_3$Tm, Tm(THD)$_3$, Tm[OOCCH(C$_2$H$_5$)C$_4$H$_9$]$_3$, Tm(O(iPr))$_3$, and Tm(acac)$_3$.

Yb precursors: Yb(N(SiMe$_3$)$_2$)$_3$, Yb(N(iPr)$_2$)$_3$, ((iPr)Cp)$_3$Yb, Cp$_3$Yb, Yb(THD)$_3$, Yb[OOCCH(C$_2$H$_5$)C$_4$H$_9$]$_3$, Yb(O(iPr))$_3$, Yb(acac)$_3$, (C$_5$Me$_5$)$_2$Yb, Yb(hfac)$_3$, and Yb(FOD)$_3$.

Lu precursors: Lu(N(SiMe$_3$)$_2$)$_3$, ((iPr)Cp)$_3$Lu, Cp$_3$Lu, Lu(THD)$_3$, Lu[OOCCH(C$_2$H$_5$)C$_4$H$_9$]$_3$, Lu(O(iPr))$_3$, and Lu(acac)$_3$.

In the above precursors, as well as precursors set forth below, the following common abbreviations are used: Si: silicon; Me: methyl; Et: ethyl; iPr: isopropyl; nPr: n-propyl; Bu: butyl; nBu: n-butyl; sBu: sec-butyl; iBu: iso-butyl; tBu: tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; mmp: methoxy-2-dimethyl-2-propionate; and FOD: 6,6,7,7,8,8,8-heptafluoro-2,2-dimethyl-3,5-octanedionate.

Embodiments of the invention may utilize a wide variety of Group III precursors for incorporating aluminum into the nitride films. For example, many aluminum precursors have the formula:

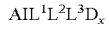

where $L^1$, $L^2$, $L^3$ are individual anionic ligands, and D is a neutral donor ligand where x can be 0, 1, or 2. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Other examples of Group III precursors include: $Al_2Me_6$, $Al_2Et_6$, $[Al(O(sBu))_3]_4$, $Al(CH_3COCHCOCH_3)_3$, $AlBr_3$, $AlI_3$, $Al(O(iPr))_3$, $[Al(NMe_2)_3]_2$, $Al(iBu)_2Cl$, $Al(iBu)_3$, $Al(iBu)_2H$, $AlEt_2Cl$, $Et_3Al_2(O(sBu))_3$, $Al(THD)_3$, $GaCl_3$, $InCl_3$, $GaH_3$, and $InH_3$.

Examples of silicon precursors include, but are not limited to, silane ($SiH_4$), disilane ($Si_2H_6$), monochlorosilane ($SiClH_3$), dichlorosilane ($SiH_2Cl_2$), trichlorosilane ($SiHCl_3$), hexachlorodisilane ($Si_2Cl_6$), diethylsilane, and alkylaminosilane compounds. Examples of alkylaminosilane compounds include, but are not limited to, di-isopropylaminosilane ($H_3Si(NiPr_2)$), bis(diethylamino)silane ($H_2Si(NEt_2)_2$), bis(diisopropylamino)silane ($H_2Si(NiPr_2)_2$, tris(isopropylamino)silane ($HSi(NiPr_2)_3$), bis(tert-butylamino)silane ($(tBu(H)N)_2SiH_2$), tetrakis(dimethylamino)silane ($Si(NMe_2)_4$), tetrakis(ethylmethylamino)silane ($Si(NEtMe)_4$), tetrakis(diethylamino)silane ($Si(NEt_2)_4$), tris(dimethylamino)silane ($HSi(NMe_2)_3$), tris(ethylmethylamino)silane ($HSi(NEtMe)_3$), tris(diethylamino)silane ($HSi(NEt_2)_3$), and tris(dimethylhydrazino)silane ($HSi(N(H)NMe_2)_3$).

Examples of nitrogen precursors include $N_2$, $NH_3$, $N_2H_4$, and $C_1$-$C_{10}$ alkylhydrazine compounds. Common $C_1$ and $C_2$ alkylhydrazine compounds include monomethyl-hydrazine ($MeNHNH_2$), 1,1-dimethyl-hydrazine ($Me_2NNH_2$), and 1,2-dimethyl-hydrazine ($MeNHNHMe$).

The present inventors have realized that exposing a substrate to a metal precursor and one or more nitrogen precursors having different reactivity characteristics toward the metal precursor can be utilized to deposit a strained metal nitride film on the substrate. Thus, a strained metal nitride film can be formed as the metal nitride film is deposited, rather than by the conventional method of post processing of deposited films. Thus, embodiments of the present invention may reduce production time and equipment necessary for forming a strained metal nitride film. Further, the strain provided during deposition of the metal nitride film may be better controlled than that of post processing methods. For example, a predetermined strain gradient throughout the metal nitride film (rather than in only a surface region) can be provided by a particular process recipe for forming the strained metal nitride film. In particular, processing conditions such as the type of precursors used, the relative amounts of precursors used and/or exposure time to each precursor can be set to provide a predetermined strain in the metal nitride film. Further, embodiments of the invention may also provide better control of thickness and conformality of the metal nitride film than methods currently in practice.

FIGS. 3A-3E and FIGS. 4A-4E, are process flow diagrams for forming strained metal nitride according to embodiments of the invention. FIGS. 6A-6E and FIGS. 7A-7E, are process flow diagrams for forming strained metal silicon nitride according to embodiments of the invention. The metal precursors, silicon precursors, and nitrogen precursors described above may be utilized to form these films.

Figure 3A:
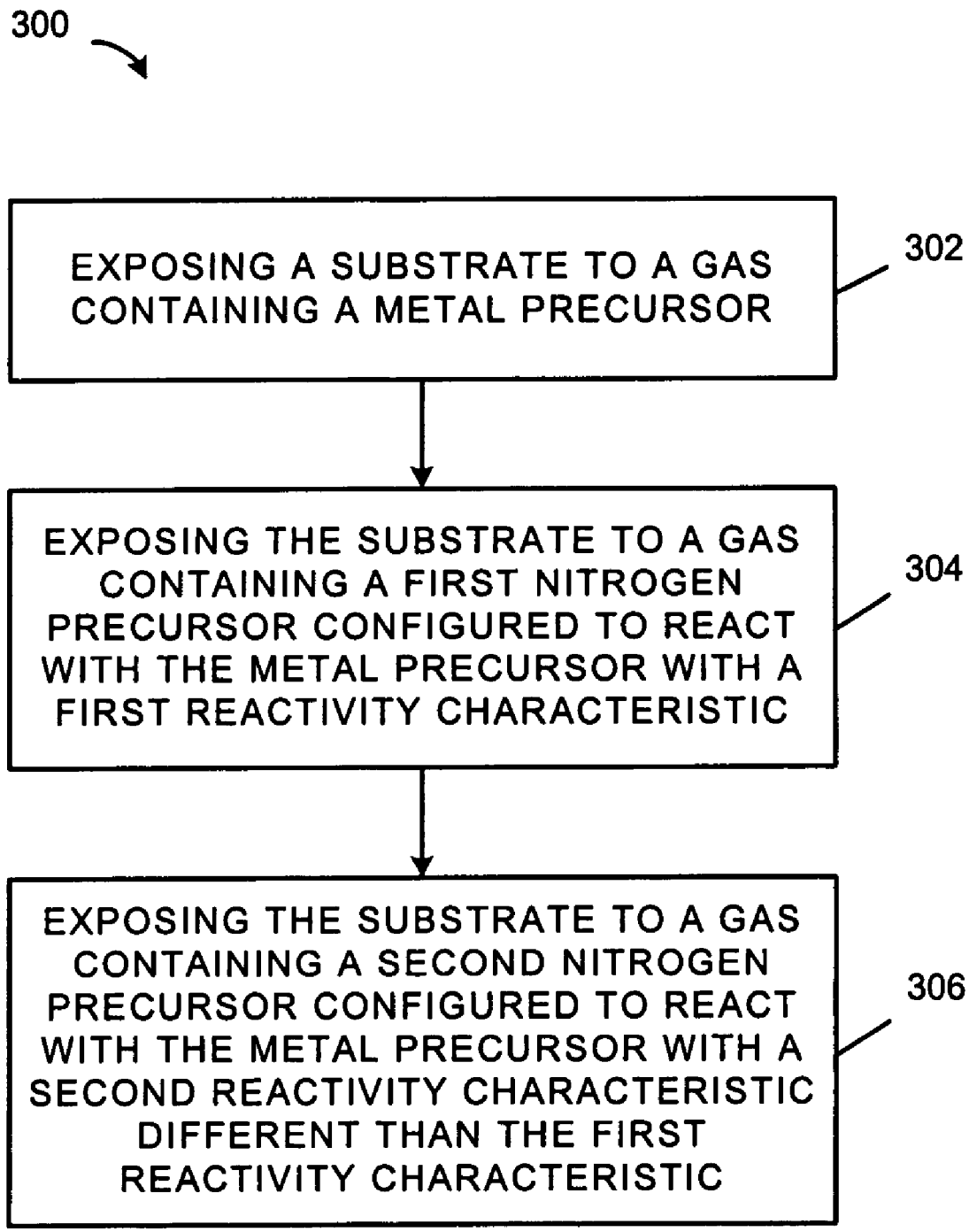
FIGS. 3A-3E are process flow diagrams for forming strained metal nitride films according to embodiments of the present invention.

FIG. 3A is a process flow diagram for forming a strained metal nitride film on a substrate in a process chamber according to an embodiment of the invention. The process 300 of FIG. 3A may, for example, be performed to form a CMOS structure such as that shown in of FIG. 1. The process 300 may be performed in processing system 1 of FIG. 2A, for example. In FIG. 3A, the process 300 includes, in step 302, exposing a substrate to a gas containing a metal precursor and optionally an inert gas such as Ar.

In step 304, the substrate is exposed to a gas containing a first nitrogen precursor configured to react with the metal precursor with a first reactivity characteristic. For example, the first nitrogen precursor may react with the metal precursor within a processing space of the chamber, or with the metal precursor adsorbed on a surface of the substrate, or both.

In step 306, the substrate is exposed to a gas containing a second nitrogen precursor configured to react with the metal precursor with a second reactivity characteristic different than the first reactivity characteristic. In the process 300, the term reactivity characteristic refers to any characteristic of the reaction between a nitrogen precursor and a metal precursor that affects a property of a metal nitride film formed on the substrate. For example, as noted above, different reactivity characteristics may be expected based on different heat of formation ($\Delta H$) for the first and second nitrogen precursors, and therefore different heat of formation for deposition of the metal nitride film. A property affected by a reactivity characteristic can be density of the metal nitride film. According to one embodiment, the first and second nitrogen precursors can be different precursor materials. For example, the first and second nitrogen precursors are selected from $NH_3$ and $N_2H_4$. However, the first and second precursors may be the same mixture of materials in different mixture ratios, as will be discussed below. In steps 304 and 306, the gas containing the first and second nitrogen precursors may further contain an inert gas such as Ar.

The steps of the process 300 depicted in FIG. 3A can be continued for a predetermined time or repeated a predetermined number of times until a strained metal nitride film with a desired thickness has been deposited onto the substrate. Further, the sequence of steps 302, 304 and 306 of the process 300 can vary widely in accordance with embodiments of the invention. For example, the metal precursor, the first nitrogen precursor, and the second nitrogen precursor can be provided in a process chamber as discrete pulses having no temporal overlap (e.g., an ALD process). Alternatively, the metal precursor, the first nitrogen precursor, and the second nitrogen precursor can be provided simultaneously (e.g., a CVD process) while varying a ratio or the first and second nitrogen precursors. Some combination of these methods may also be used. For example, the metal precursor can be continuously provided to the process chamber while the first and second nitrogen precursors are pulsed, or both the metal precursor and first nitrogen precursors can be continuously provided, while the second nitrogen precursor is pulsed. As would be understood by one of ordinary skill in the art, various combinations are possible, and embodiments of the invention are not limited by the specific examples described in FIGS. 3A-3E herein.

Figure 3B:
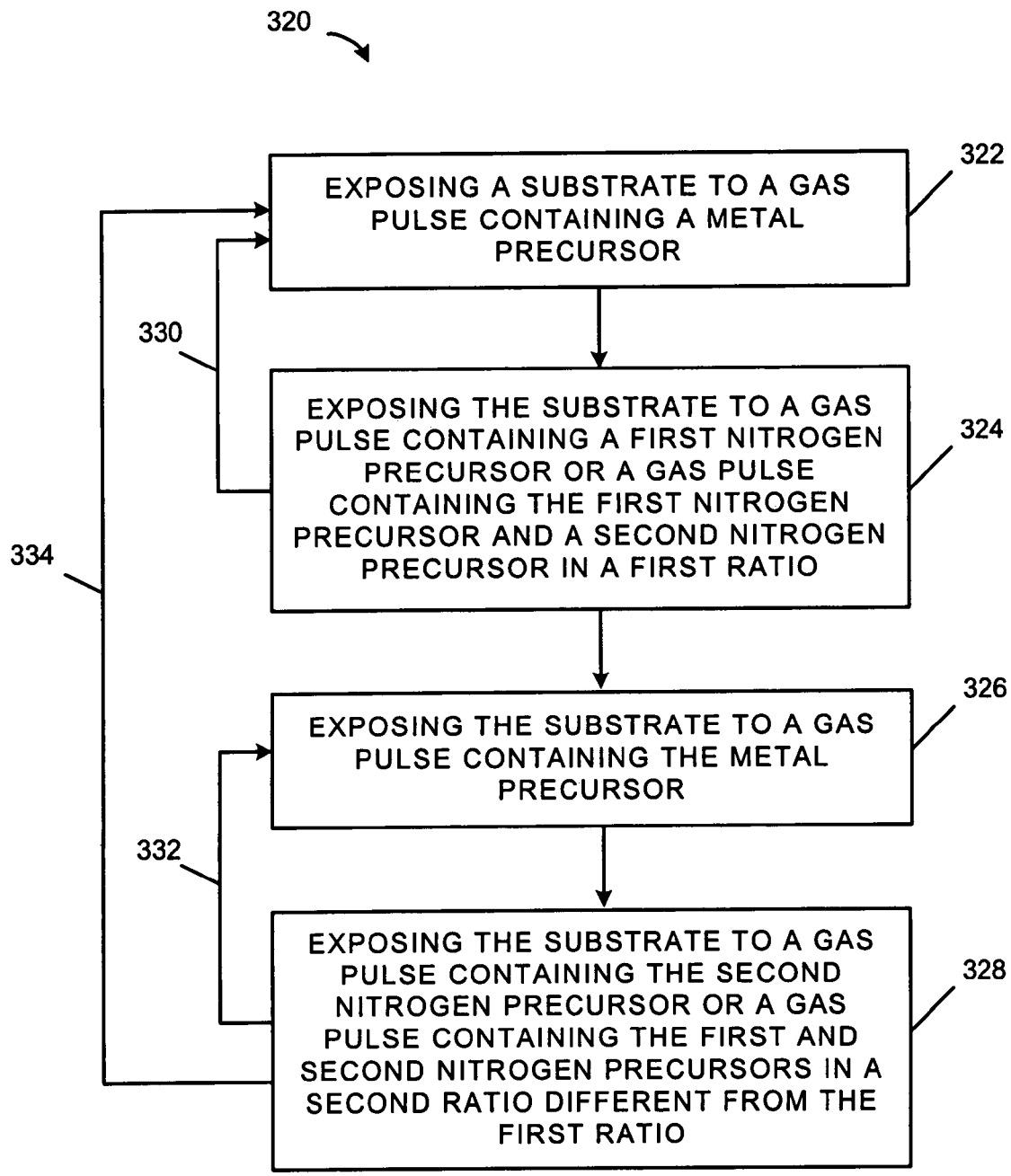

FIG. 3B is a process flow diagram for forming a strained metal nitride film according to an embodiment of the invention. The process 320 depicted in FIG. 3B is an ALD process that includes sequential gas exposures of a metal precursor and nitrogen precursors with partial or no temporal overlap between the different gas pulses. The process 320 includes, in step 322, exposing a substrate to a gas pulse containing a metal precursor and optionally an inert gas such as Ar.

In step 324, the substrate is exposed to a gas pulse containing a first nitrogen precursor or a gas pulse containing the first nitrogen precursor and a second nitrogen precursor in a first ratio. The first ratio may, for example, be defined as $N_1/N_2$ or $N_1/(N_1+N_2)$, where $N_1$ and $N_2$ refer to the amounts of the first and second nitrogen precursors, respectively. According to one embodiment, the first ratio may be varied from a ratio corresponding to substantially pure first nitrogen precursor, to another ratio corresponding to a combination of the first and second nitrogen precursors, to yet another ratio corresponding to substantially pure second nitrogen precursor. In one example, a ratio $N_1/(N_1+N_2)$ may increase monotonically as 0, 0.05, 0.10, ..., 0.90, 0.95, and 1.0, during deposition of the metal nitride film. The first and second nitrogen precursors can, for example, be selected from $NH_3$, $N_2H_4$, and $C_1$-$C_{10}$ alkylhydrazine compounds. According to one embodiment, the first and second nitrogen precursors are selected from $NH_3$ and $N_2H_4$. The gas, pulse may further contain an inert gas such as Ar.

In step 326, the substrate is exposed to a second gas pulse containing the metal precursor and optionally an inert gas such as Ar. In step 328, the substrate is exposed to a gas pulse containing the second nitrogen precursor or a gas pulse containing the first nitrogen precursor and the second nitrogen precursor in a second ratio different from the first ratio. Thus, in the embodiment of FIG. 3B, first and second nitrogen precursors, and first and second ratios of different nitrogen precursors are explicitly described. However, as noted above, the first and second precursors may be considered the same mixture of materials in different mixture ratios. The gas pulse can further contain an inert gas such as Ar.

The steps 322-328 may be repeated a predetermined number of times as shown by the process flow 334 until a strained metal nitride film with a desired thickness has been deposited onto the substrate. The process chamber may be purged with an inert gas, evacuated, or both purged and evacuated after each of steps 322, 324, 326, and 328.

According to one embodiment, steps 322 and 324 may be sequentially performed a first number of times as shown by the process flow 330, prior to performing steps 326 and 328.

According to another embodiment, steps 326 and 328 may be sequentially performed a second number of times as shown by the process flow 332, prior to repeating steps 322 and 324 in the process flow 334. In this regard, it is to be understood that the terms "a first number of times" and "a second number of times" are used to provide different terms for ease of understanding. However, the first and second number of times can be the same or a different number.

According to yet another embodiment, steps 322 and 324 may be sequentially performed a first number of times prior to performing steps 326 and 328 as shown by the process flow 330, and steps 326 and 328 may be sequentially performed a second number of times as shown by the process flow 332, prior to repeating steps 322 and 324 in the process flow 334.

According to one embodiment, step 324 comprises exposing the substrate to a gas pulse containing a first nitrogen precursor and step 328 comprises exposing the substrate to a gas pulse containing a second nitrogen precursor. Furthermore, steps 322 and 324 may be sequentially performed a first number of times as shown by the process flow 330, prior to performing steps 326 and 328. Furthermore, steps 326 and 328 may be sequentially performed a second number of times as shown by the process flow 332, prior to repeating steps 322 and 324 in the process flow 334.

According to one embodiment, steps 322 and 324 may be sequentially performed a first number of times that decreases monotonically and steps 326 and 328 may be sequentially performed a second number of times that increases monotonically each time process flow 334 is performed. In one example, in step 322, the substrate is exposed to a gas pulse containing a metal precursor, in step 324, the substrate is exposed to a gas pulse containing a first nitrogen precursor, and steps 322 and 324 are repeating twice using the process flow 330. Thereafter, in step 326, the substrate is exposed to a gas pulse containing the metal precursor, and in step 328; the substrate is exposed to a gas pulse containing a second nitrogen precursor. Next, in step 322, the substrate is exposed to a gas pulse containing the precursor, in step 324, the substrate is exposed to a gas pulse containing the first nitrogen precursor, and steps 322 and 324 are repeated once using the process flow 330. Thereafter, in step 326, the substrate is exposed to a gas pulse containing the metal precursor, in step 328, the substrate is exposed to a gas pulse containing the second nitrogen precursor, and steps 326 and 328 are repeated once using the process flow 332. Next, in step 322, the substrate is exposed to a gas pulse containing the metal precursor, and in step 324, the substrate is exposed to a gas pulse containing the first nitrogen precursor without repeat using process flow 330. Thereafter, in step 326, the substrate is exposed to a gas pulse containing the metal precursor, in step 328, the substrate is exposed to a gas pulse containing the second nitrogen precursor, and steps 326 and 328 are repeated twice using process flow 332. In this example, the first number of times decreases from 3 to 2 to 1 and the second number of times increases from 1 to 2 to 3 during deposition of the strained metal nitride film. In one example, the first and second nitrogen precursors can be selected from $NH_3$ and $N_2H_4$.

According to one embodiment of the invention, steps 322) and 324) of FIG. 3B may have at least partial temporal overlap. According to another embodiment of the invention, steps 326) and 328) may have at least partial temporal overlap. According to yet another embodiment of the invention, steps 326 and 328 may have no temporal overlap and steps 326 and 328 may have no temporal overlap.

Figure 3C:
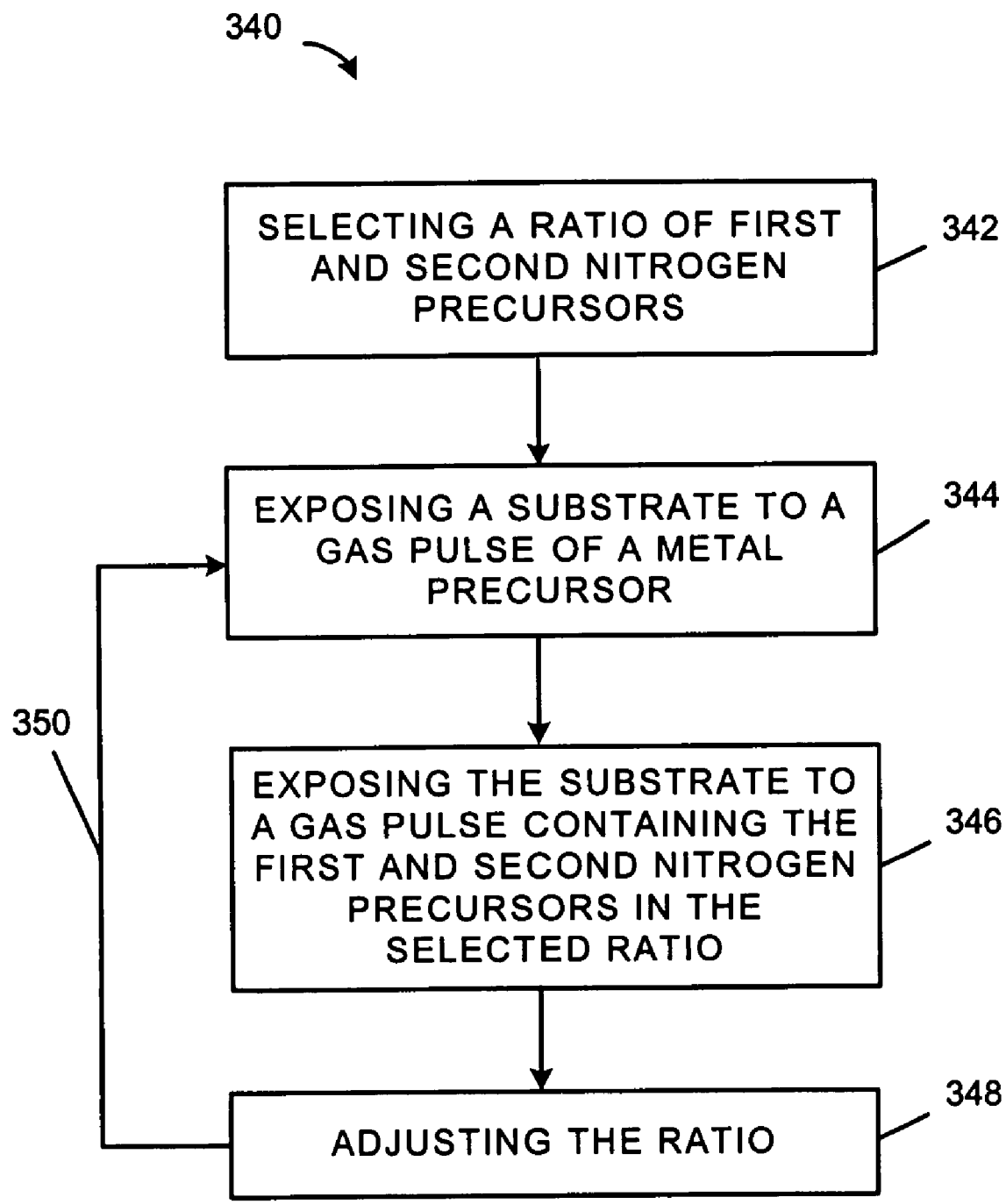

FIG. 3C is a process flow diagram for forming a strained metal nitride film according to another embodiment of the present invention. The process 340 includes, in step 342, selecting a ratio of first and second nitrogen precursors. The ratio can range from a first nitrogen precursor only, to a mixture of the first and second nitrogen precursor, to the second nitrogen precursor only. In step 344, the substrate is exposed to a gas pulse containing a metal precursor, and in step 346, the substrate is exposed to a gas pulse containing the first and second nitrogen precursors in the selected ratio. In step 348, the ratio is adjusted and step 344 is repeated as shown by the process flow 350. According to one embodiment, the ratio of the first and second nitrogen precursors can monotonically increase or decrease during deposition of the metal nitride film. The process 340 may be performed as a pulsed CVD process that includes interrupted gas exposures of a metal precursor and different nitrogen precursors with at least partial temporal overlap of the gas pulses in steps 344 and 346. Alternately, the process 340 may be performed as an ALD process with no overlap of the gas pulses in steps 344 and 346.

Figure 3D:
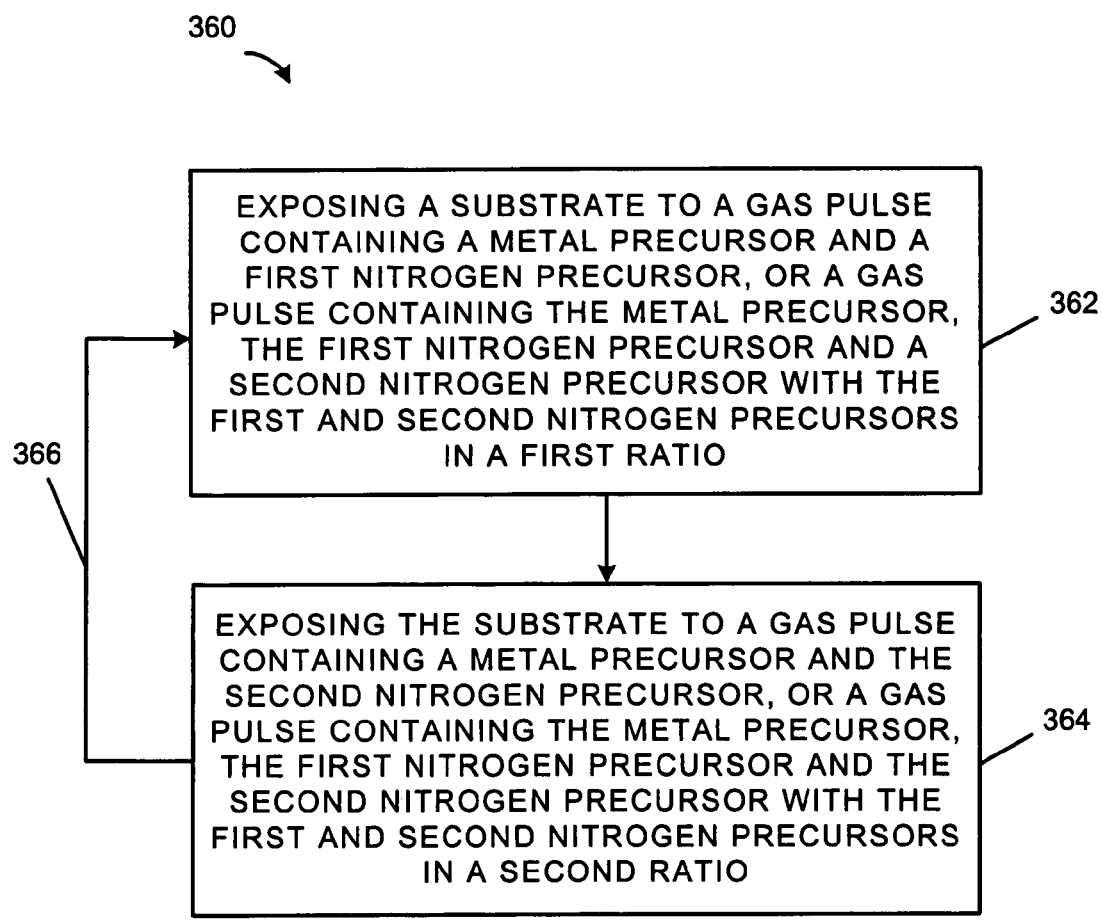

FIG. 3D is a process flow diagram for forming a strained metal nitride film according to another embodiment of the present invention. The process 360 includes, in step 362, exposing a substrate to a gas pulse containing a metal precursor and a first nitrogen precursor or a gas pulse containing the metal precursor, the first nitrogen precursor, and a second nitrogen precursor, where the gas pulse contains the first and second nitrogen precursors in a first ratio. In step 364, the substrate is exposed to a gas pulse containing the metal precursor and the second nitrogen precursor, or a gas pulse containing the metal precursor and the first and second nitrogen precursors in a second ratio. Steps 362 and 364 can be repeated to deposit the metal nitride film to a desired thickness as shown by process flow 366. According to one embodiment, the first ratio can monotonically increase and the second ratio can monotonically decrease during deposition of the metal nitride film.

Figure 3E:
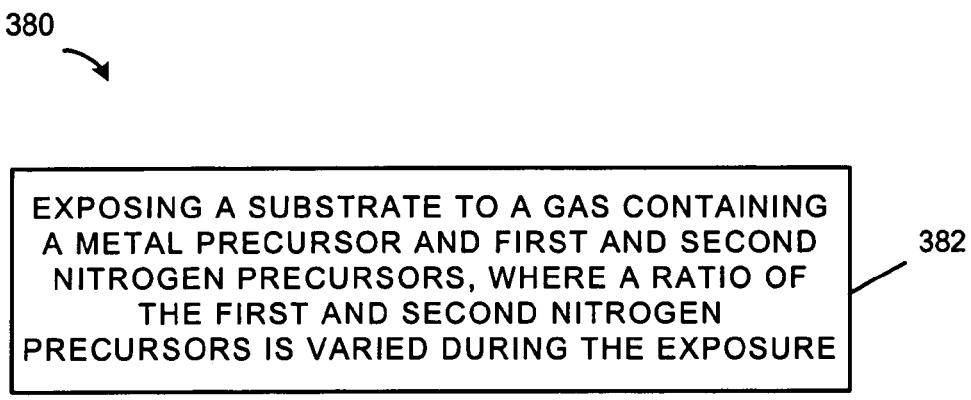

FIG. 3E is a process flow diagram for forming a strained metal nitride film according to another embodiment of the present invention. The process 380 includes, in step 382, exposing a substrate to a gas containing a metal precursor and first and second nitrogen precursors, where a ratio of the first and second nitrogen precursors is varied during the exposure. In one example the ratio of the first and second nitrogen precursors can monotonically increase or decrease during deposition of the metal nitride film.

Figure 4A:
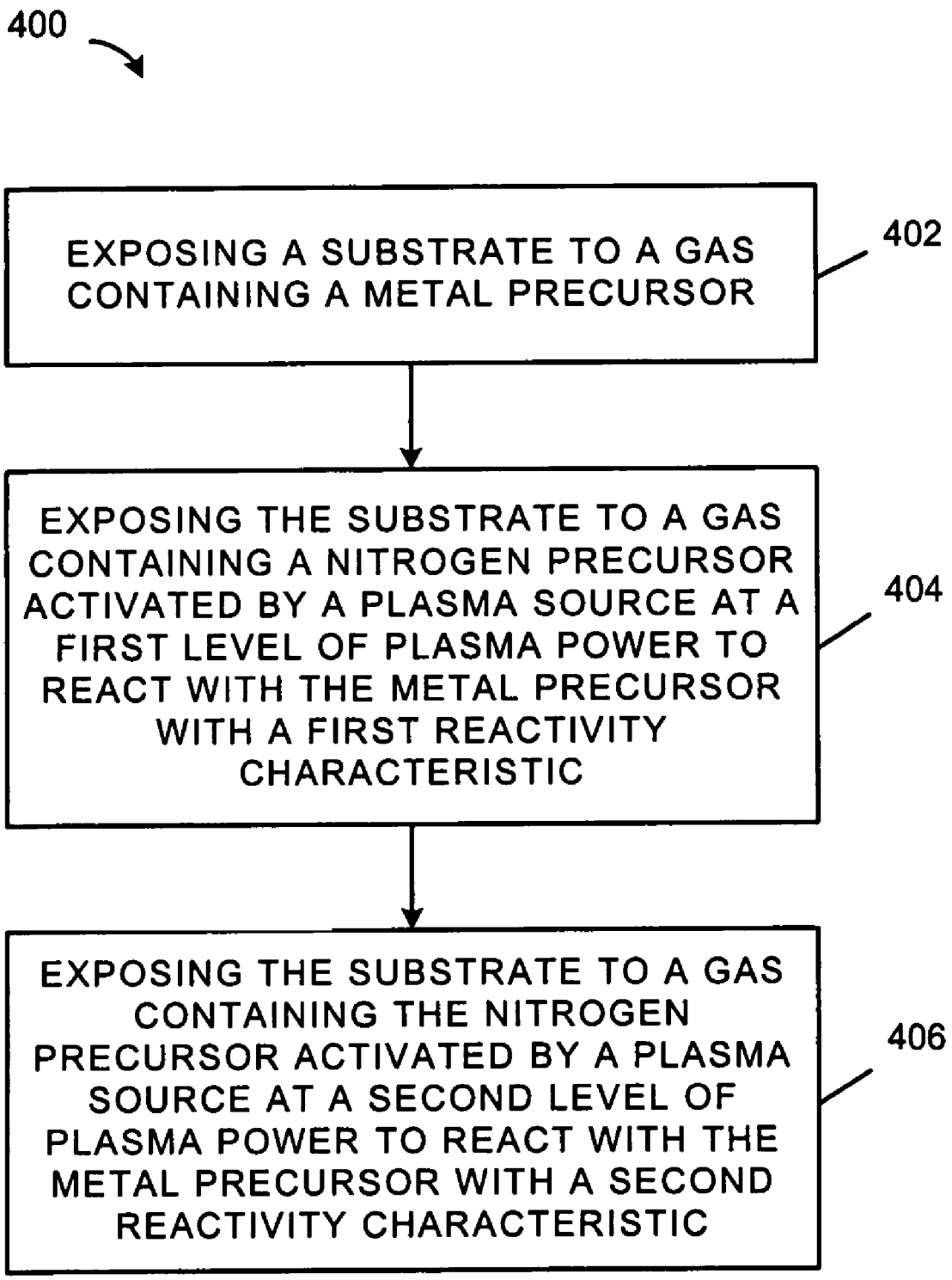
FIGS. 4A-4E are process flow diagrams for forming strained metal nitride films according to embodiments of the present invention.

FIG. 4A is a process flow diagram for forming a strained metal nitride film on a substrate in a process chamber according to an embodiment of the present invention. The process 400 of FIG. 4A may be performed in a processing system 2 of FIG. 2B, for example. As seen in FIG. 4A, the process 400 includes, in step 402, exposing a substrate to a gas containing a metal precursor and optionally an inert gas such as Ar.

In step 404, the substrate is exposed to a gas containing a nitrogen precursor activated by a plasma source at a first level of plasma power to react with the metal precursor with a first reactivity characteristic. In one embodiment, the first level of plasma power is less than a plasma activation power (e.g., 0 W) and therefore a plasma is not activated. The plasma activation of the nitrogen precursor affects a property of a metal nitride film formed on the substrate, for example the deposition rate and the density of the metal nitride film. The plasma activated nitrogen precursor may react with the metal precursor within a processing space of the chamber, or with metal precursor adsorbed on a surface of the substrate, or both.

In step 406, the substrate is exposed to a gas containing the nitrogen precursor activated by the plasma source at a second level of plasma power to react with the metal precursor with a second reactivity characteristic different than the first reactivity characteristic.

Plasma activation of a nitrogen precursor (or other precursors) can result in electronic excitation and/or ionization of the nitrogen precursor that affects reactivity towards a metal precursor. In addition, plasma activation can result in at least partial dissociation of the nitrogen precursor, thereby creating a modified nitrogen precursor with a different reactivity towards the metal precursor. Increasing the level of plasma power and plasma density, for example, will generally increase the amount of electronically excited, ionized, and at least partially dissociated nitrogen precursor. In addition, increased levels of plasma power and plasma density may be utilized to vary the concentration of additional charged species (e.g., Argon ions, electrons, or both) in the plasma environment. These additional charged species may interact with the metal nitride film and the substrate during deposition, thereby affecting a reactivity characteristic and a property (e.g., density, strain) of at least a portion of a thickness of the metal nitride film.

The steps of the process 400 depicted in FIG. 4A can be continued for a predetermined time or repeated a predetermined number of times until a strained metal nitride film with a desired thickness has been deposited onto the substrate. Further, the sequence of steps 402, 404 and 406 of the process 400 can vary widely in accordance with embodiments of the invention. For example, the metal precursor and the plasma activated nitrogen precursor can be provided in the process chamber as discrete gas pulses having no temporal overlap, where the level of plasma power is varied for the discrete gas pulses. Alternatively, the metal precursor and the nitrogen precursor may be flowed continuously while simply varying the level of plasma power. Some combination of these methods may also be used. For example, the metal precursor can be continuously provided to the chamber while the nitrogen precursor and the plasma are pulsed at different levels of plasma power, or both the metal and the nitrogen precursor can be continuously provided and the plasma is pulsed at different levels of plasma power. As would be understood by one of ordinary skill in the art, various combinations are possible, and embodiments of the invention are not limited by the specific examples described in FIGS. 4A-4E herein.

Figure 4B:
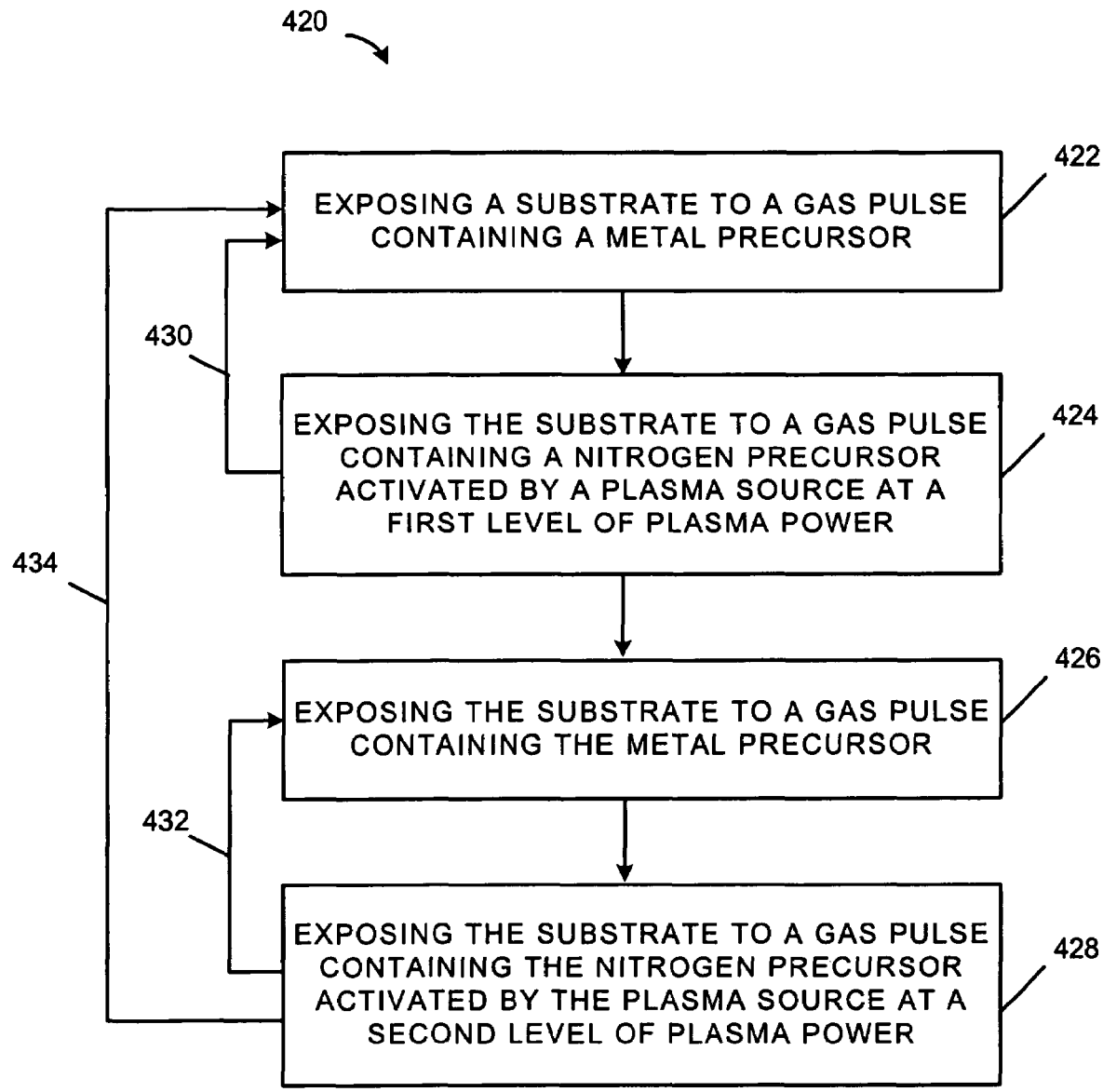

FIG. 4B is a process flow diagram for forming a strained metal nitride film according to an embodiment of the invention. The process 420 is a PEALD process similar to the ALD process 320 of FIG. 3B and includes sequential gas exposures of a metal precursor and a plasma activated nitrogen precursor with partial or no temporal overlap between the different gas pulses.

The process 420 includes, in step 422, exposing a substrate to a gas pulse containing a metal precursor and optionally an inert gas such as Ar. In step 424, the substrate is exposed to a gas pulse containing a nitrogen precursor activated by a plasma source at a first level of plasma power. In step 426, the substrate is exposed to a second gas pulse containing the metal precursor. In step 428, the substrate is exposed to a gas pulse containing the nitrogen precursor activated by the plasma source at a second level of plasma power.

Figure 5A:
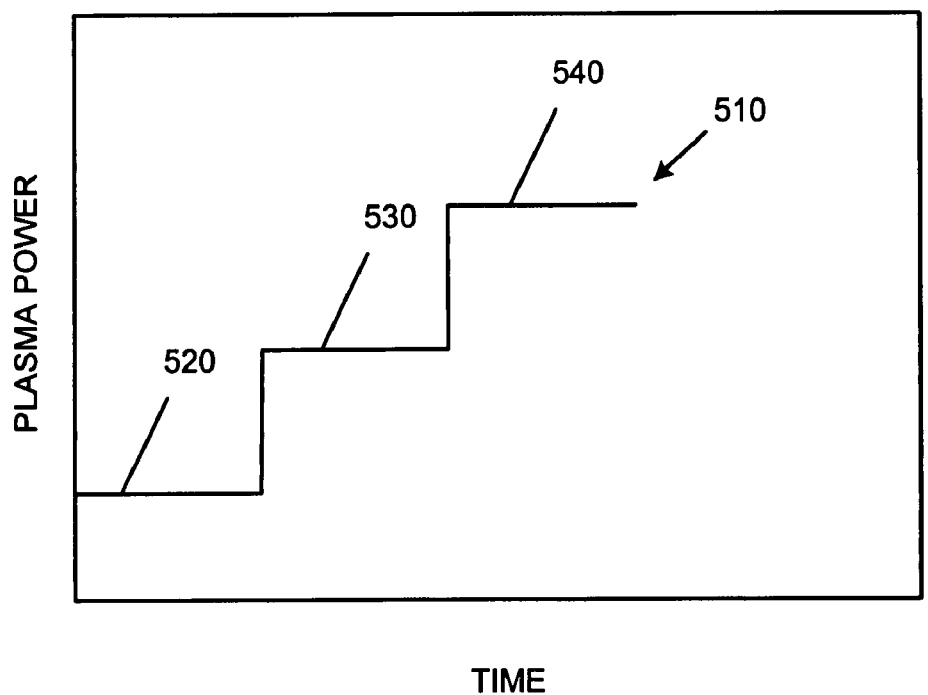
FIGS. 5A and 5B show power graphs depicting different levels of plasma power coupled to a process chamber according to embodiments of the invention.
Figure 5B:
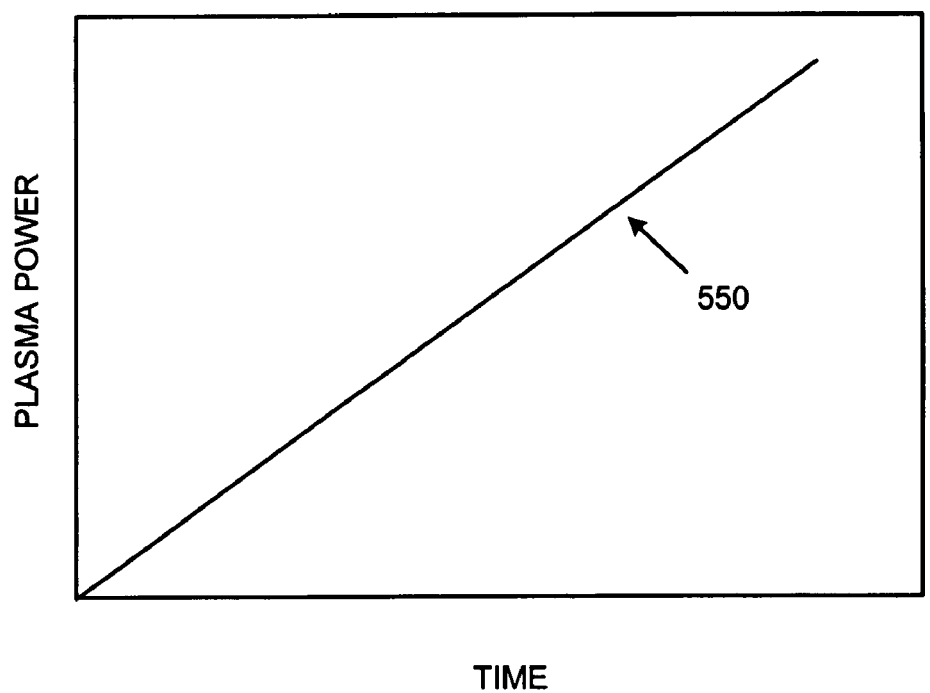

FIGS. 5A and 5B show power graphs depicting different levels of plasma power coupled to a process chamber in accordance with embodiments of the invention. As shown by the exemplary power curve 510 in FIG. 5A, the level of plasma power may be applied to the process chamber in a plurality discrete levels, 520, 530, and 540. In one example, the power level 520 may be at or below a lower limit for plasma formation and the power level 540 may correspond to a maximum desired level of plasma power. The maximum desired level of plasma power is preferably not higher than a level determined to disrupt or damage the substrate including any deposited films thereon. As seen in FIG. 5B, the level of plasma power may be applied to the process chamber in a continuously changing fashion represented by the power curve 550.

As would be understood by one of ordinary skill in the art, the power curves of FIGS. 5A and 5B are exemplary, and the varying level of plasma power may depend on the composition and characteristic of the film to be deposited by the process. For example, the plasma power of FIG. 5A can include more than three (3) discrete levels of plasma power, and the plasma power of FIG. 5B may change in a non-linear fashion. Moreover, a combination of stepped and ramped power can be used to vary the level of plasma power. Further, the power may be provided in discrete pulses where power is on or off. Still further, suitable high levels of plasma power that enable deposition of a film at improved deposition speeds and with reduced impurities in accordance with an embodiment of the invention can be determined by direct experimentation and/or design of experiments (DOE). Other adjustable process parameters such as substrate temperature, process pressure, type of process gas and relative gas flows can also be determined by direct experimentation and/or DOE.

Referring back to FIG. 4A, steps 422-428 may be repeated a predetermined number of times as shown by the process flow 434 until a strained metal nitride film with a desired thickness has been deposited onto the substrate. The process chamber may be purged with an inert gas, evacuated, or both purged and evacuated after each of steps 422, 424, 426, and 428.

According to one embodiment, steps 422 and 424 may be sequentially performed a first number of times as shown by the process flow 430, prior to performing steps 426 and 428.

According to another embodiment, steps 426 and 428 may be sequentially performed a second number of times as shown by the process flow 432, prior to repeating steps 422 and 424 in the process flow 434.

According to yet another embodiment, steps 422 and 424 may be sequentially performed a first number of times prior to performing steps 426 and 428 as shown by the process flow 430, and steps 426 and 428 may be sequentially performed a second number of times as shown by the process flow 432, prior to repeating steps 422 and 424 in the process flow 434.

According to one embodiment, the first number of times may decrease monotonically and the second number of times may increase monotonically each time process flow 434 is performed. In one example, in step 422, the substrate is exposed to a gas pulse containing a metal precursor, in step 424, the substrate is exposed to a gas pulse containing a nitrogen precursor activated by a plasma source at a first level of plasma power, and steps 422 and 424 are repeated twice using the process flow 430. Thereafter, in step 426, the substrate is exposed to a gas pulse containing the metal precursor, and in step 428, the substrate is exposed to a gas pulse containing the nitrogen precursor activated by the plasma source at a second level of plasma power. Next, in step 422, the substrate is exposed to a gas pulse containing the precursor, in step 424, the substrate is exposed to a gas pulse containing the nitrogen precursor activated by the plasma source at the first level of plasma power, and steps 422 and 424 are repeated once using the process flow 430. Thereafter, in step 426, the substrate is exposed to a gas pulse containing the metal precursor, in step 428, the substrate is exposed to a gas pulse containing the nitrogen precursor activated by the plasma source at a first level of plasma power, and steps 426 and 428 are repeated once using the process flow 432. Next, in step 422, the substrate is exposed to a gas pulse containing the metal precursor, and in step 424, the substrate is exposed to a gas pulse containing the nitrogen precursor activated by the plasma source at the first level of plasma power. Thereafter, in step 426, the substrate is exposed to a gas pulse containing the metal precursor, in step 428, the substrate is exposed toga gas pulse containing the nitrogen precursor activated by the plasma source at the second level of plasma power, and steps 426 and 428 are repeated twice using process flow 432. In this example, the first number of times decreases from 3 to 2 to 1 and the second number of times increases from 1 to 2 to 3 during deposition of the strained metal nitride film. In one example, the nitrogen precursor can be selected from $NH_3$ and $N_2H_4$.

Still referring to FIG. 4B, according to one embodiment of the invention, the gas pulse in step 424 may further comprise a dilution gas in a first ratio with the nitrogen precursor, and step 428 may further comprise the dilution gas in a second ratio with the nitrogen precursor, where the second ratio is different from the first ratio. The addition of a dilution gas to a nitrogen precursor can affect the plasma density in the process chamber and thus the amount of activated nitrogen precursor available to interact with the metal precursor. The dilution gas may be selected from He, Ar, Ne, Kr, Xe, $H_2$, or $N_2$, or a combination of two or more thereof. The first ratio may, for example, be defined as D/N or D/(D+N), where D and N refer to the amounts of the dilution gas and the nitrogen precursor, respectively. According to one embodiment, the first ratio may be varied from ratio corresponding to substantially pure nitrogen precursor, to a another ratio corresponding to a combination of the dilution gas and the nitrogen precursor, to yet another ratio corresponding to substantially pure dilution gas. In one example, a ratio D/(D+N) may increase monotonically as 0, 0.05, 0.10, . . . , 0.90, 0.95, and 1.0, during deposition of the metal nitride film.

Figure 4C:
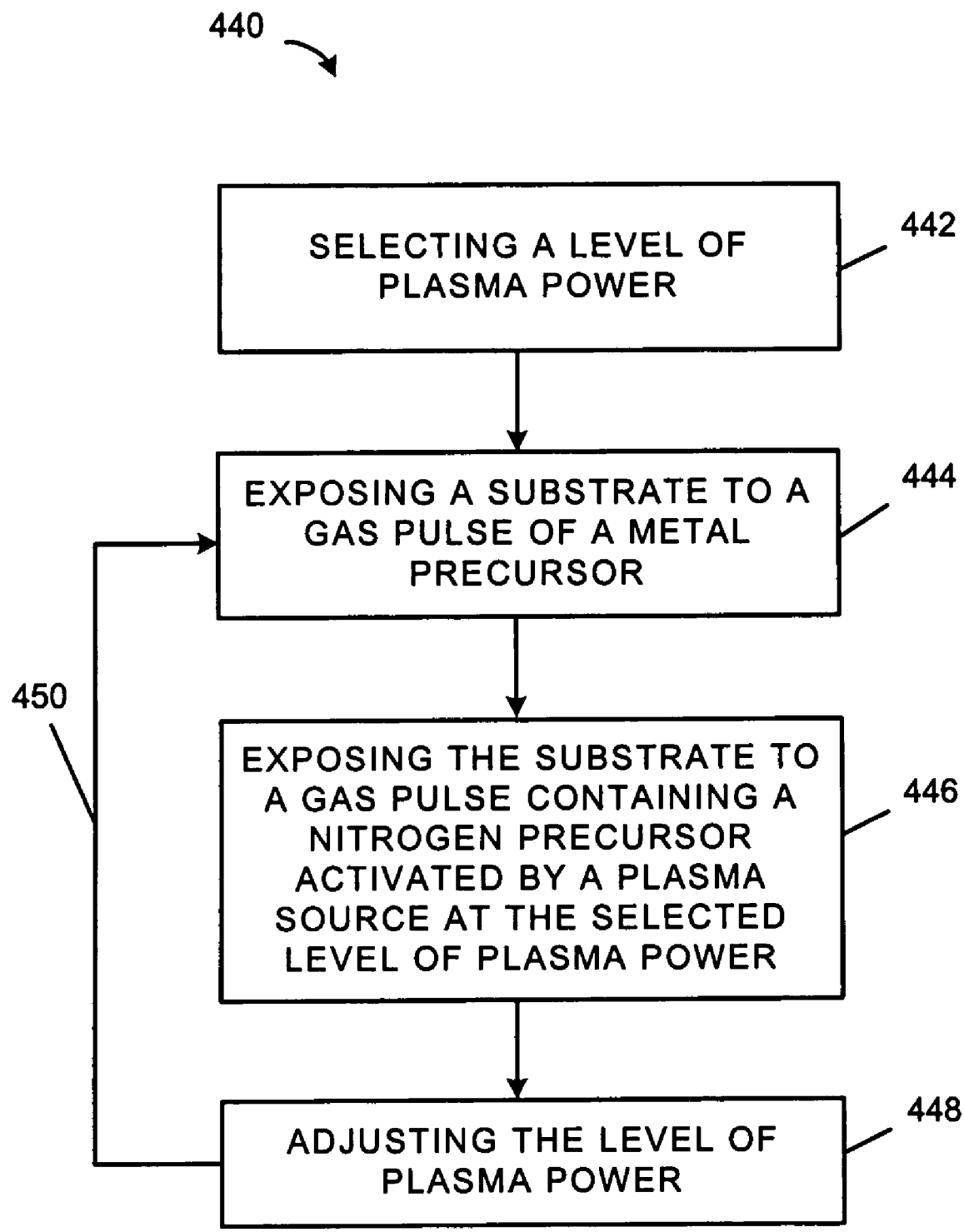

FIG. 4C is a process flow diagram for forming a strained metal nitride film according to another embodiment of the present invention. The process 440 includes, in step 442, selecting a level of plasma power. The level of plasma power can range from a first level at or below a lower limit for plasma formation to a second level of plasma power corresponding to a maximum desired level of plasma power. Thus, the first level of plasma power can be 0 W of plasma power. In step 444, the substrate is exposed to a gas pulse, containing a metal precursor, and in step 446, the substrate is exposed to a gas pulse containing a nitrogen precursor activated by the plasma source at the selected level of plasma power. In step 448, the level of plasma power is adjusted, and step 444 is repeated as shown by the process flow 450. According to one embodiment, the level of plasma power can monotonically increase or decrease during deposition of the metal nitride film. The process 440 may be performed as a pulsed PECVD process that includes interrupted gas exposures of a metal precursor and a plasma activated nitrogen precursor with at least partial temporal overlap of the gas pulses in steps 444 and 446. Alternately, the process 440 may be performed as a PEALD process with no overlap of the gas pulses in steps 444 and 446.

Still referring to FIG. 4C, according to one embodiment of the invention, the gas pulse in step 446 may further comprise a dilution gas in a first ratio with the nitrogen precursor, and step 448 may further comprise adjusting the amount of dilution gas from the first ratio to a second ratio different from the first ratio.

Figure 4D:
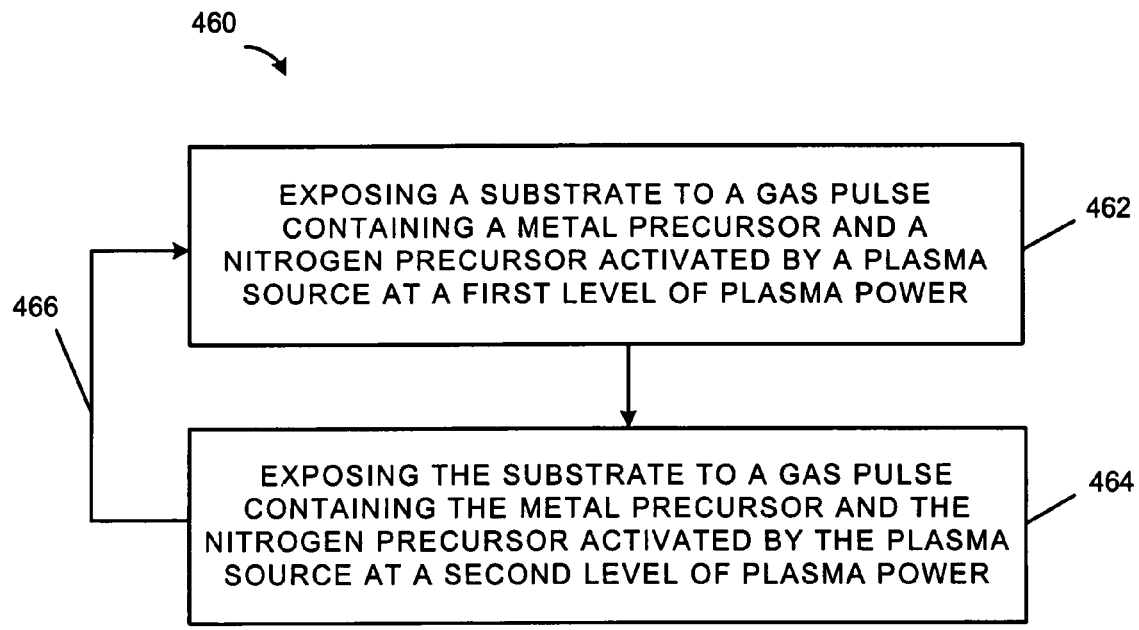

FIG. 4D is a process flow diagram for forming a strained metal nitride film according to another embodiment of the invention. The process 460 includes, in step 462, exposing a substrate to a gas pulse containing a metal precursor and a nitrogen precursor activated by a plasma source at a first level of plasma power. In step 464, the substrate is exposed to a gas pulse containing the metal precursor and the nitrogen precursor activated by the plasma source at a second level of plasma power different from the first level of plasma power. According to one embodiment of the invention, the gas pulse in step 462 may further comprise a dilution gas in a first ratio with the nitrogen precursor and step 464 may further comprises the dilution gas in a second ratio with the nitrogen precursor, where the second ratio is different from the first ratio.

Figure 4E:
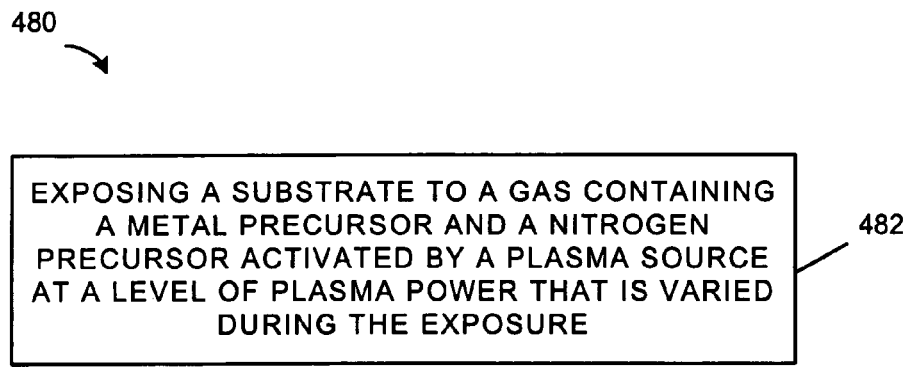

FIG. 4E is a process flow diagram for forming a strained metal nitride film according to another embodiment of the present invention. The process 480 includes, in step 482, exposing a substrate to a gas containing a metal precursor and a nitrogen precursor activated by a plasma source at a level of plasma power that is varied during the exposure. In one example the level of plasma power can monotonically increase or decrease during deposition of the metal nitride film. According to one embodiment of the invention, the gas pulse in step 482 may further comprise a dilution gas in a ratio with the nitrogen precursor where the ratio is varied during the exposure. In one example the ratio can monotonically increase or decrease during deposition of the metal nitride film.

The present inventors have realized that exposing a substrate to a metal precursor, a silicon precursor, and one or more nitrogen precursors having different reactivity characteristics toward the metal precursor or the silicon precursor can be utilized to deposit a strained metal silicon nitride film on the substrate. Thus, a strained metal silicon nitride film can be formed as the metal silicon nitride film is deposited, rather than by the conventional method of post processing of deposited films. Thus, embodiments of the present invention may reduce production time and equipment necessary for forming a strained metal silicon nitride film. Further, the strain provided during deposition of the metal silicon nitride film may be better controlled than that of post processing methods. For example, a predetermined strain gradient throughout the metal silicon nitride film (rather than in only a surface region) can be provided by a particular process recipe for forming the strained metal silicon nitride film. In particular, processing conditions such as the type of precursors used, the relative amounts of precursors used, exposure time to each precursor can be set to provide a predetermined strain in the metal silicon nitride film. Further, embodiments of the invention may also provide better control of thickness and conformality of the metal silicon nitride film than methods currently in practice.

The processes of FIGS. 3A-3E and FIGS. 4A-4E may further include activating a plasma during one or more of the exposing steps. Further, a power coupled to the plasma may be varied to provide a different reactivity characteristic, as will be discussed below. That is, the embodiments of FIGS. 3A-3E and FIGS. 4A-4E using different first and second nitrogen precursors (or different ratios of first and second nitrogen precursors) may be combined with the plasma power variation embodiments discussed below.

Figure 6A:
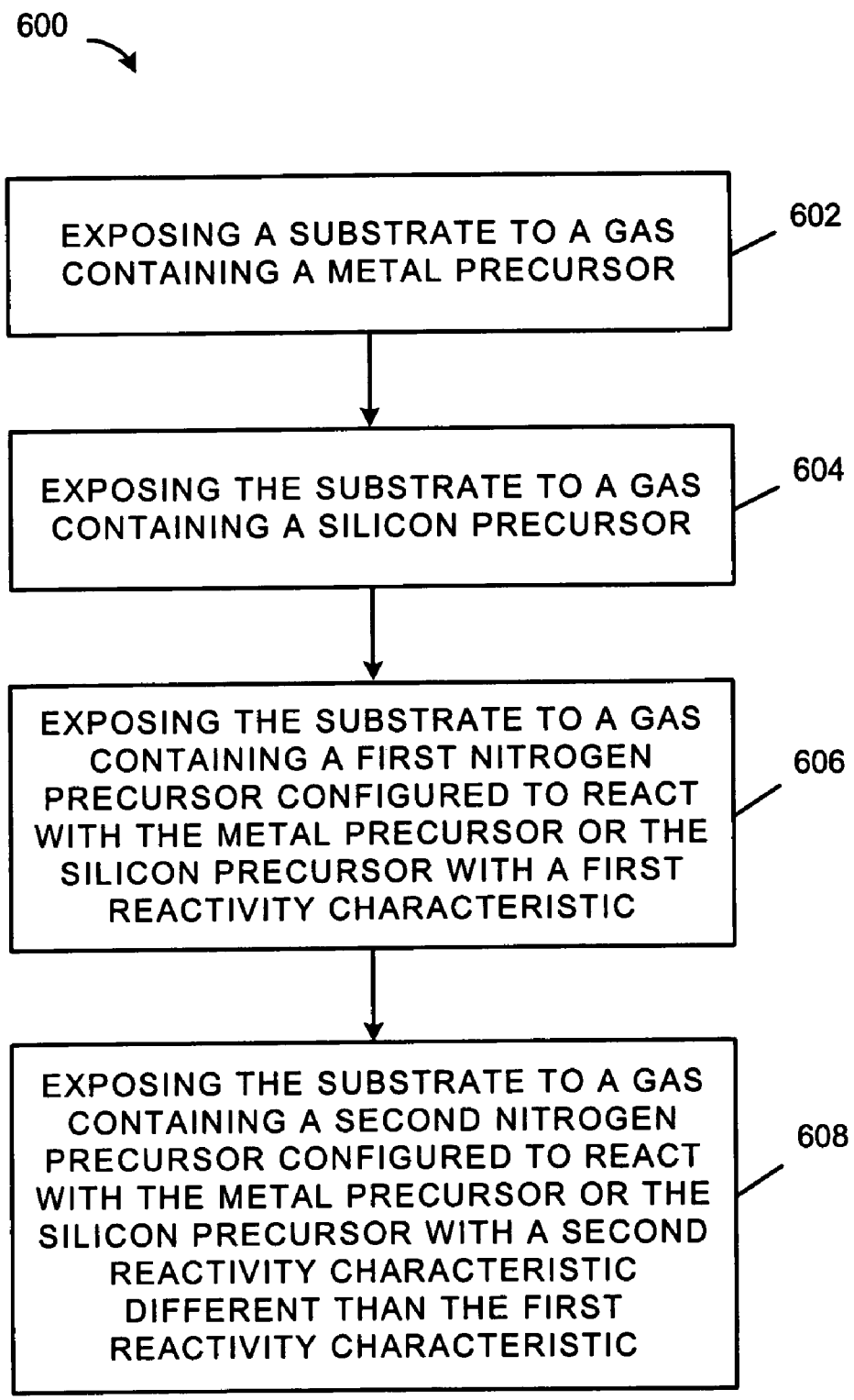
FIGS. 6A-6E are process flow diagrams for forming strained metal silicon nitride films according to embodiments of the present invention.

FIG. 6A is a process flow diagram for forming a strained metal silicon nitride film on a substrate in a process chamber according to an embodiment of the invention. The process 600 of FIG. 6A may, for example, be performed to form a CMOS structure such as that shown in of FIG. 1. The process 600 may be performed in processing system 1 of FIG. 2A, for example. As seen in FIG. 6A, the process 600 includes, in step 602, exposing a substrate to a gas containing a metal precursor and optionally an inert gas such as Ar. In step 604, the substrate is exposed to a gas containing a silicon precursor and optionally an inert gas such as Ar.

In step 606, the substrate is exposed to a gas containing a first nitrogen precursor configured to react with the metal precursor or the silicon precursor with a first reactivity characteristic. For example, the first nitrogen precursor may react with metal precursor or the silicon precursor within a processing space of the chamber, or with the metal precursor or the silicon precursor adsorbed on a surface of the substrate, or both.

In step 608, the substrate is exposed to a gas containing a second nitrogen precursor configured to react with the metal precursor or the silicon precursor with a second reactivity characteristic different than the first reactivity characteristic. In the process of 608, the term reactivity characteristic refers to any characteristic of the reaction between a nitrogen precursor and a metal precursor or a silicon precursor that affects a property of a metal silicon nitride film formed on the substrate. For example, as noted above, different reactivity characteristics may be expected based on different heat of formation ($\Delta H$) for the first and second nitrogen precursors, and therefore different heat of formation for deposition of the metal silicon nitride film. A property affected by a reactivity characteristic can be density of the metal silicon nitride film. According to one embodiment, the first and second nitrogen precursors are selected from $NH_3$ and $N_2H_4$. In steps 606 and 608, the gas containing the first and second nitrogen precursors may further contain an inert gas such as Ar.

The steps of the process 600 depicted in FIG. 6A can be continued for a predetermined time or repeated a predetermined number of times until a strained metal silicon nitride film with a desired thickness has been deposited onto the substrate. Further, the sequence of steps 602, 604, 606, and 608 of the process 600 can vary widely in accordance with embodiments of the invention. For example, the metal precursor, the silicon precursor, the first nitrogen precursor, and the second nitrogen precursor can be provided in a process chamber as discrete pulses having no temporal overlap (e.g., an ALD process). Alternatively, the metal precursor, silicon precursor, the first nitrogen precursor, and the second nitrogen precursor can be provided simultaneously (e.g., a CVD process) while varying a ratio or the first and second nitrogen precursors. Some combination of these methods may also be used. For example, the metal precursor and the silicon precursor can be continuously provided to the process chamber while the first and second nitrogen precursors are pulsed, or the metal precursor, the silicon precursor, and the first nitrogen precursor can be continuously provided, while the second nitrogen precursor is pulsed. As would be understood by one of ordinary skill in the art, various combinations are possible, and embodiments of the invention are not limited by the specific examples described in FIGS. 6A-6E herein.

Figure 6B:
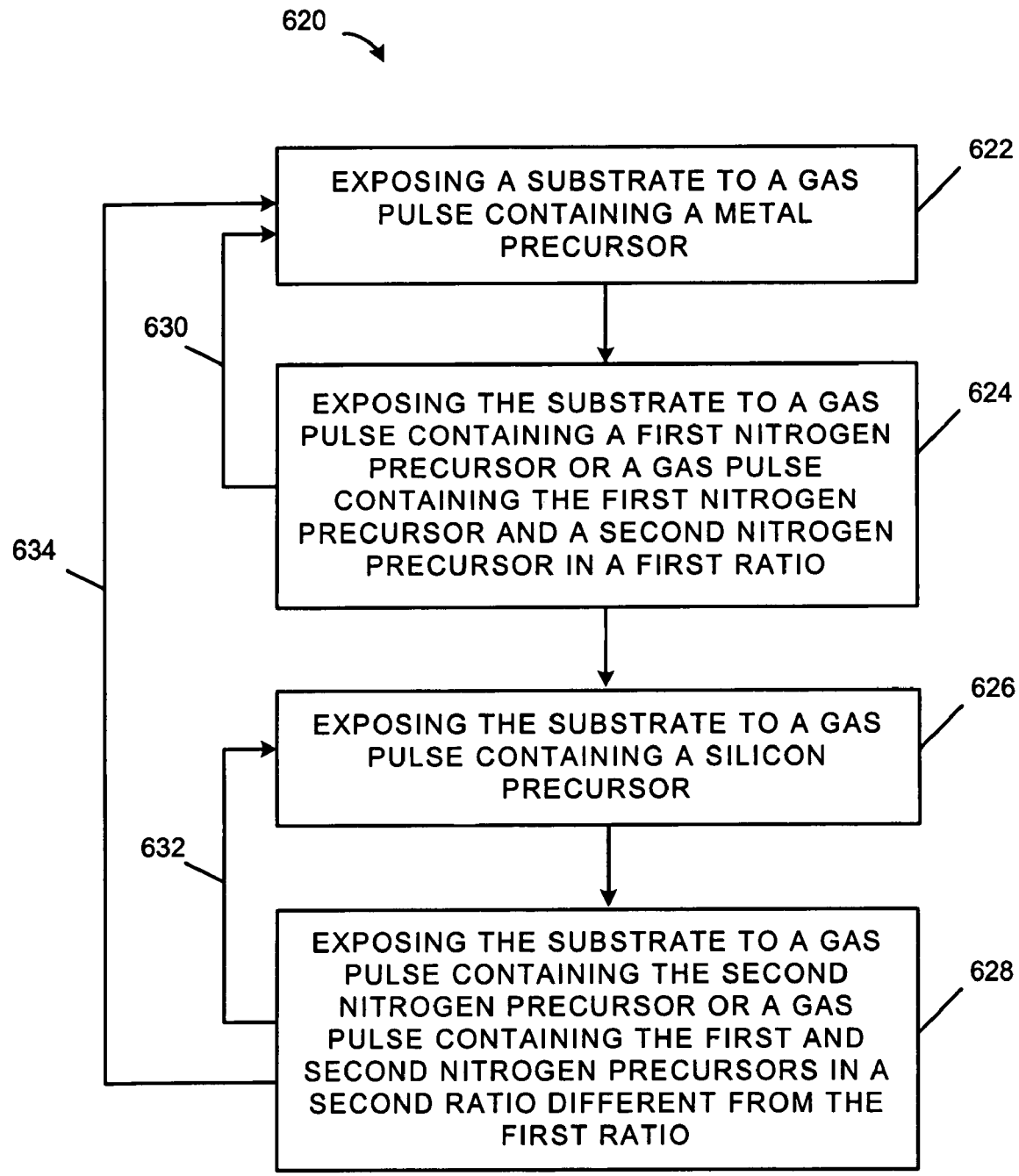

FIG. 6B is a process flow diagram for forming a strained metal silicon nitride film according to an embodiment of the invention. The process 620 depicted in FIG. 6B is an ALD process that includes sequential gas exposures of a metal precursor, a silicon precursor, and nitrogen precursors with partial or no temporal overlap between the different gas pulses. The process 620 includes, in step 622, exposing a substrate to a gas pulse containing a metal precursor and optionally an inert gas such as Ar.

In step 624, the substrate is exposed to a gas pulse containing a first nitrogen precursor or a gas pulse containing the first nitrogen precursor and a second nitrogen precursor in a first ratio. The first ratio may, for example, be defined as $N_1/N_2$ or $N_1/(N_1+N_2)$, where $N_1$ and $N_2$ refer to the amounts of the first and second nitrogen precursors, respectively. According to one embodiment, the first ratio may be varied from a ratio corresponding to substantially pure first nitrogen precursor, to another ratio corresponding to a combination of the first and second nitrogen precursors, to yet another ratio corresponding to substantially pure second nitrogen precursor. In one example, a ratio $N_1/(N_1+N_2)$ may increase monotonically as 0, 0.05, 0.10, . . . , 0.90, 0.95, and 1.0, during deposition of the metal silicon nitride film. The first and second nitrogen precursors can, for example, be selected from $NH_3$, $N_2H_4$, and $C_1$-$C_{10}$ alkylhydrazine compounds. According to one embodiment, the first and second nitrogen precursors are selected from $NH_3$ and $N_2H_4$. The gas pulse may further contain an inert gas such as Ar.

In step 626, the substrate is exposed to a gas pulse containing a silicon precursor and optionally an inert gas such as Ar. In step 628, the substrate is exposed to a gas pulse containing the second nitrogen precursor or a gas pulse containing the first nitrogen precursor and the second nitrogen precursor in a second ratio different from the first ratio. The gas pulse can further contain an inert gas such as Ar.

The steps 622-628 may be repeated a predetermined number of times as shown by the process flow 634 until a strained metal silicon nitride film with a desired thickness has been deposited onto the substrate. The process chamber may be purged with an inert gas, evacuated, or both purged and evacuated after each of steps 622, 624, 626, and 628.

According to one embodiment, steps 622 and 624 may be sequentially performed a first number of times as shown by the process flow 630, prior to performing steps 626 and 628.

According to another embodiment, steps 626 and 628 may be sequentially performed a second number of times as shown by the process flow 632, prior to repeating steps 622 and 624 in the process flow 634.

According to yet another embodiment, steps 622 and 624 may be sequentially performed a first number of times prior to performing steps 626 and 628 as shown by the process flow 630, and steps 626 and 628 may be sequentially performed a second number of times as shown by the process flow 632, prior to repeating steps 622 and 624 in the process flow 634.

According to one embodiment, step 624 comprises exposing the substrate to a gas pulse containing a first nitrogen precursor and step 628 comprises exposing the substrate to a gas pulse containing a second nitrogen precursor. Furthermore, steps 622 and 624 may be sequentially performed a first number of times as shown by the process flow 630, prior to performing steps 626 and 628. Furthermore, steps 626 and 628 may be sequentially performed a second number of times as shown by the process flow 632, prior to repeating steps 622 and 624 in the process flow 634.

According to one embodiment, steps 622 and 624 may be sequentially performed a first number of times that decreases monotonically and steps 626 and 628 may be sequentially performed a second number of times that increases monotonically each time process flow 634 is performed. In one example, in step 622, the substrate is exposed to a gas pulse containing a metal precursor, in step 624, the substrate is exposed to a gas pulse containing a first nitrogen precursor, and steps 622 and 624 are repeated twice using the process flow 630. Thereafter, in step 626, the substrate is exposed to a gas pulse containing a silicon precursor, and in step 628, the substrate is exposed to a gas pulse containing a second nitrogen precursor. Next, in step 622, the substrate is exposed to a gas pulse containing the precursor, in step 624, the substrate is exposed to a gas pulse containing the first nitrogen precursor, and steps 622 and 624 are repeated once using the process flow 630. Thereafter, in step 626, the substrate is exposed to a gas pulse containing the silicon precursor, in step 628, the substrate is exposed to a gas pulse containing the second nitrogen precursor, and steps 626 and 628 are repeated once using the process flow 632. Next, in step 622, the substrate is exposed to a gas pulse containing the metal precursor, and in step 624, the substrate is exposed to a gas pulse containing the first nitrogen precursor without repeat using process flow 630. Thereafter, in step 626, the substrate is exposed to a gas pulse containing the silicon precursor, in step 628, the substrate is exposed to a gas pulse containing the second nitrogen precursor, and steps 626 and 628 are repeated twice using process flow 632. In this example, the first number of times decreases from 3 to 2 to 1 and the second number of times increases from 1 to 2 to 3 during deposition of the strained metal silicon nitride film. In one example, the first and second nitrogen precursors can be selected from $NH_3$ and $N_2H_4$.

According to one embodiment of the invention, steps 622 and 624 of FIG. 6B may have at least partial temporal overlap. According to another embodiment of the invention, steps 626 and 628 may have at least partial temporal overlap. According to yet another embodiment of the invention, steps 622 and 624 may have no temporal overlap and steps 626 and 628 may have no temporal overlap.

Figure 6C:
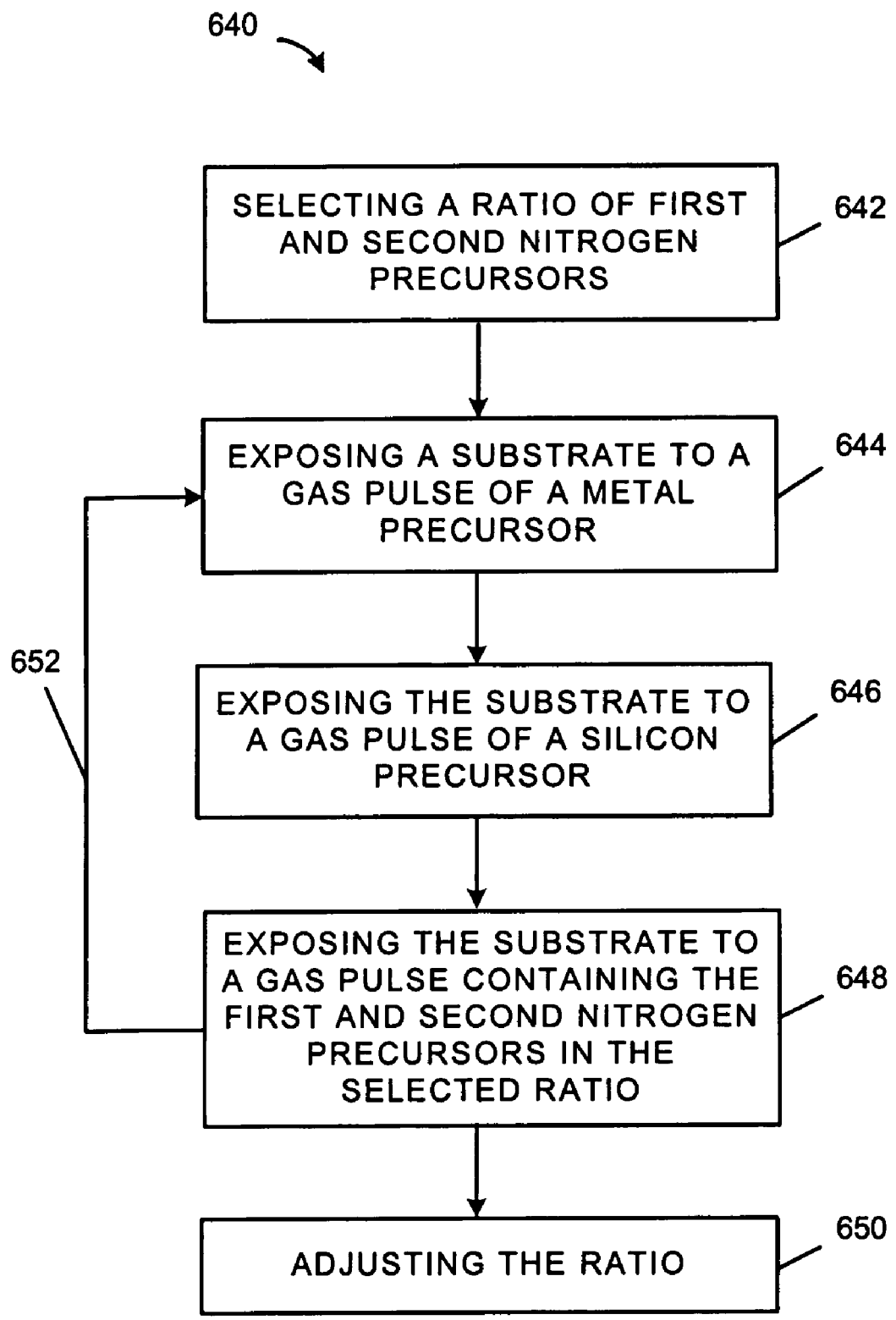

FIG. 6C is a process flow diagram for forming a strained metal silicon nitride film according to another embodiment of the present invention. The process 640 includes, in step 642, selecting a ratio of first and second nitrogen precursors. The ratio can range from a first nitrogen precursor only, to a mixture of the first and second nitrogen precursors, to the second nitrogen precursor only. In step 644, the substrate is exposed to a gas pulse containing a metal precursor, in step 646, the substrate is exposed to a gas pulse containing a silicon precursor, and in step 648, the substrate is exposed to a gas pulse containing the first and second nitrogen precursors in the selected ratio. In step 650, the ratio is adjusted and step 644 is repeated as shown by the process flow 652. According to one embodiment, the ratio of the first and second nitrogen precursors can monotonically increase or decrease during deposition of the metal silicon nitride film. The process 640 may be performed as a pulsed CVD process that includes interrupted gas exposures of a metal precursor, a silicon precursor, and different nitrogen precursors with at least partial temporal overlap of the gas pulses in steps 644, 646, and 648. Alternately, the process 640 may be performed as an ALD process with no overlap of the gas pulses in steps 644, 646, and 648.

Figure 6D:
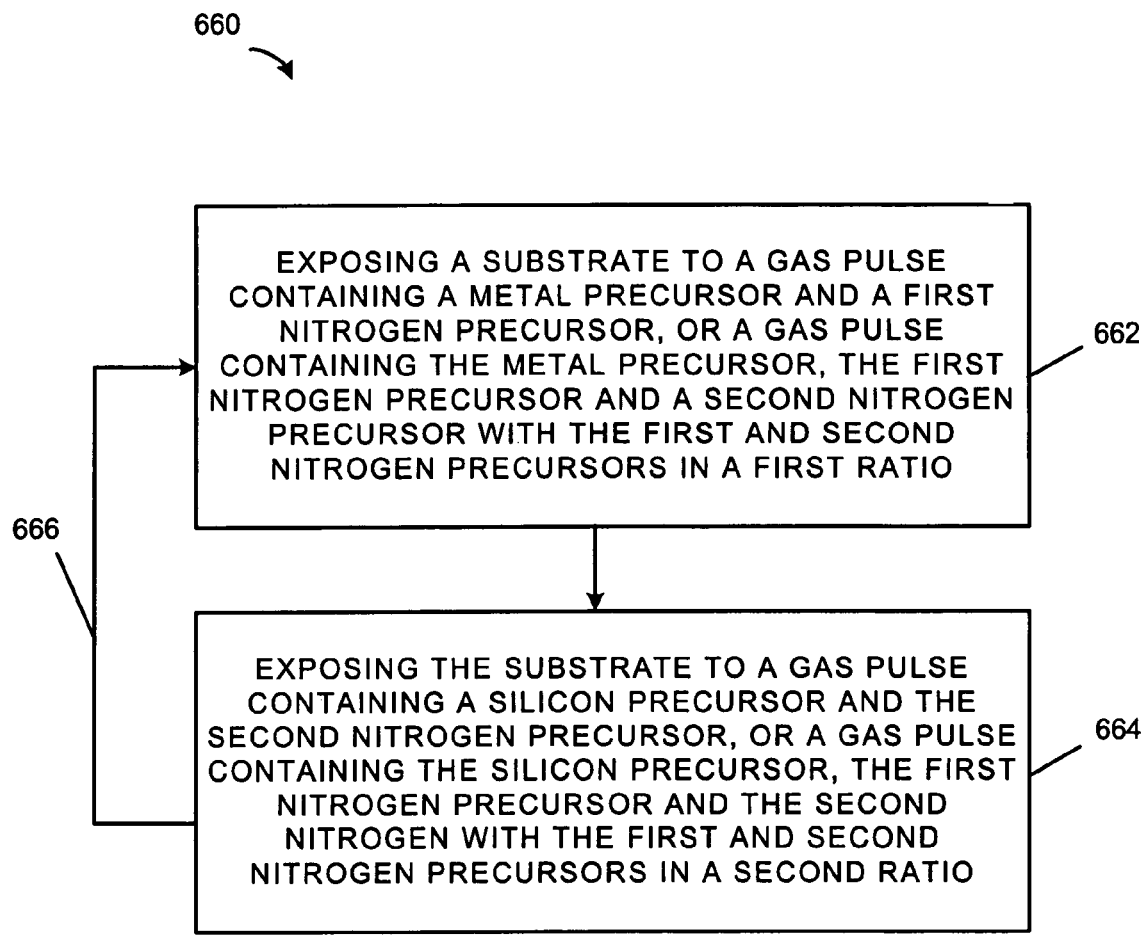

FIG. 6D is a process flow diagram for forming a strained metal silicon nitride film according to another embodiment of the present invention. The process 660 includes, in step 662, exposing a substrate to a gas pulse containing a metal precursor and a first nitrogen precursor or a gas pulse containing the metal precursor, the first nitrogen precursor, and a second nitrogen precursor where the gas pulse contains the first and second nitrogen precursors in a first ratio. In step 664, the substrate is exposed to a gas pulse containing a silicon precursor and the second nitrogen precursor, or a gas pulse containing the silicon precursor and the first and second nitrogen precursors in a second ratio. Steps 662 and 664 can be repeated to deposit the metal nitride film to a desired thickness as shown by process flow 366. According to one embodiment, the first ratio can monotonically increase and the second ratio can monotonically decrease during deposition of the metal silicon nitride film.

According to one embodiment of the invention, the gas pulse in step 662 may further contain a silicon precursor and the gas pulse in step 664 may further contain a metal precursor.

According to one embodiment of the invention, in the process 660, the first ratio, the second ratio, or both the first and second ratios, may be varied between a ratio corresponding to substantially pure first nitrogen precursor and a ratio corresponding to substantially pure second nitrogen precursor. In one example, the first or second ratios may be varied monotonically.

Figure 6E:
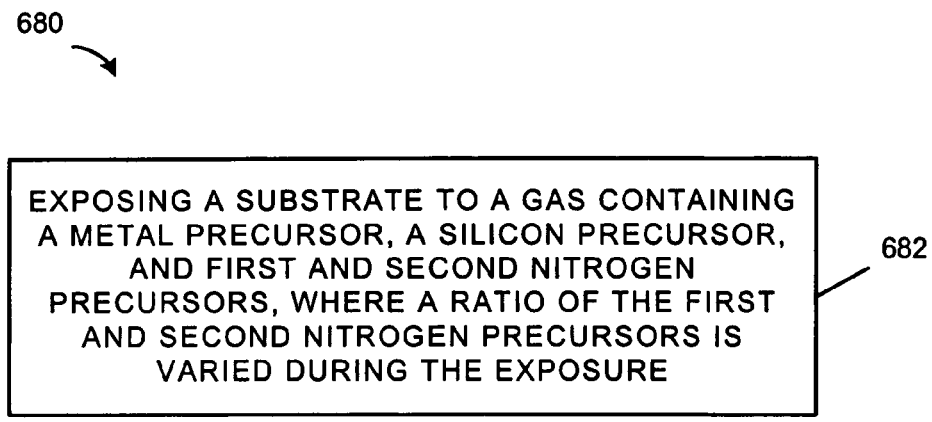

FIG. 6E is a process flow diagram for forming a strained metal silicon nitride film according to another embodiment of the present invention. The process 680 includes, in step 682, exposing a substrate to a gas containing a metal precursor, a silicon precursor and first and second nitrogen precursors, where a ratio of the first and second nitrogen precursors is varied during the exposure. In one example the ratio of the first and second nitrogen precursors can monotonically increase or decrease during deposition of the metal silicon nitride film.

Figure 7A:
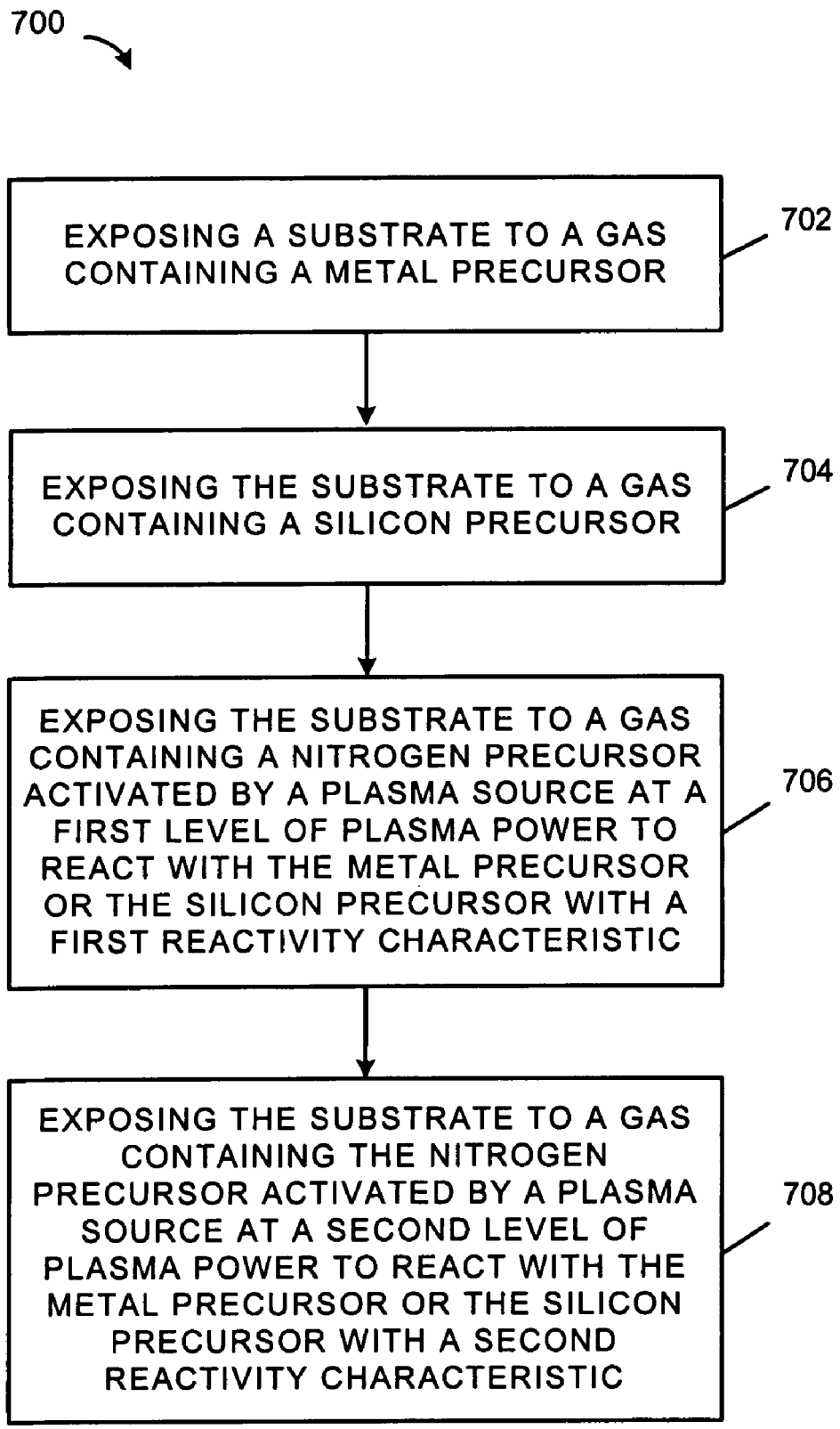
FIGS. 7A-7E are process flow diagrams for forming strained metal silicon nitride films according to embodiments of the present invention.

FIG. 7A is a process flow diagram for forming a strained metal silicon nitride film on a substrate in a process chamber according to an embodiment of the present invention. The process 700 of FIG. 7A may be performed in a processing system 2 of FIG. 2B, for example. As seen in FIG. 7A, the process 700 includes, in step 702, exposing a substrate to a gas containing a metal precursor and optionally an inert gas such as Ar. In step 704, the substrate is exposed to a gas containing a silicon precursor and optionally an inert gas such as Ar.

In step 706, the substrate is exposed to a gas containing a nitrogen precursor activated by a plasma source at a first level of plasma power to react with the metal precursor or the silicon precursor with a first reactivity characteristic. In one embodiment, the first level of plasma power is less than a plasma activation power (e.g. 0 W) and therefore a plasma is not activated. The plasma activation of the nitrogen precursor affects a property of a metal silicon nitride film formed on the substrate, for example the deposition rate and the density of the metal silicon nitride film. The plasma activated nitrogen precursor may react with the metal precursor or the silicon precursor within a processing space of the chamber, or with the metal precursor or the silicon precursor adsorbed on a surface of the substrate, or both.

In step 708, the substrate is exposed to a gas containing the nitrogen precursor activated by the plasma source at a second level of plasma power to react with the metal precursor or the silicon precursor with a second reactivity characteristic different than the first reactivity characteristic.

The steps of the process 700 depicted in FIG. 7A can be continued for a predetermined time or repeated a predetermined number of times until a strained metal silicon nitride film with a desired thickness has been deposited onto the substrate. Further, the sequence of steps 702, 704, 706 and 708 of the process 700 can vary widely in accordance with embodiments of the invention. For example, the metal precursor, the silicon precursor, and the nitrogen precursor can be provided in the process chamber as discrete gas pulses having no temporal overlap, where the level of plasma power is varied for the discrete gas pulses. Alternatively, the metal precursor, the silicon precursor and the nitrogen precursor may be flowed continuously while simply varying the level of plasma power. Some combination of these methods may also be used. For example, the metal precursor and the silicon precursor can be continuously provided to the chamber while the nitrogen precursor and the plasma are pulsed at different levels of plasma power, or the metal, the silicon precursor and the nitrogen precursor can be continuously provided and the plasma is pulsed at different levels of plasma power. As would be understood by one of ordinary skill in the art, various combinations are possible, and embodiments of the invention are not limited by the specific examples described in FIGS. 7A-7E herein.

Figure 7B:
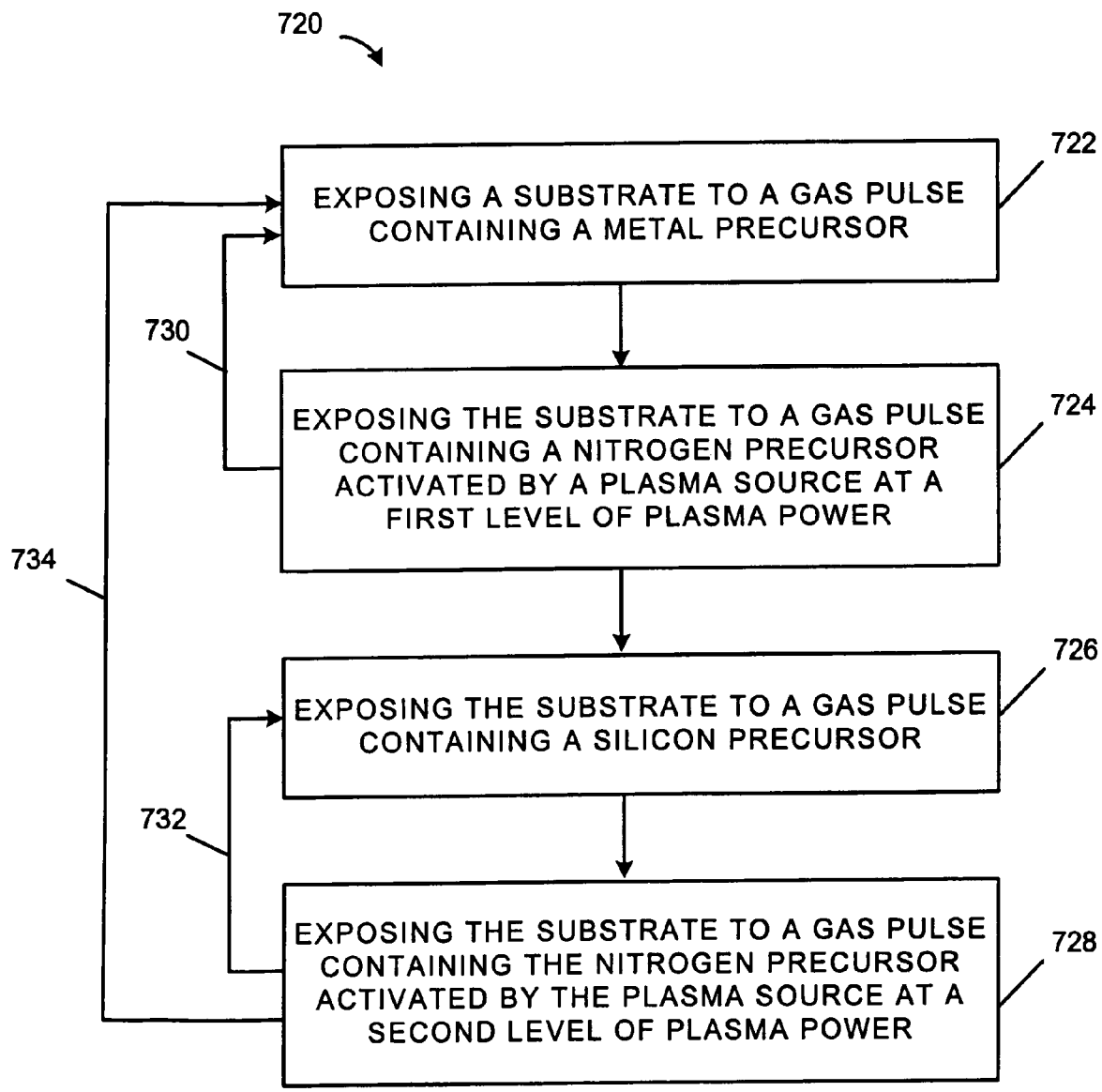

FIG. 7B is a process flow diagram for forming a strained metal silicon nitride film according to an embodiment of the invention. The process 720 is PEALD process similar to the ALD process 620 of FIG. 6B and includes sequential gas exposures of a metal precursor, a silicon precursor, and a plasma activated nitrogen precursor with partial or no temporal overlap between the different gas pulses.

The process 720 includes, in step 722, exposing a substrate to ga gas pulse containing a metal precursor and optionally an inert gas such as Ar. In step 724, the substrate is exposed to a gas pulse containing a nitrogen precursor activated by a plasma source at a first level of plasma power. In step 726, the substrate is exposed to a gas pulse containing a silicon precursor. In step 728, the substrate is exposed to a gas pulse containing the nitrogen precursor activated by the plasma source at a second level of plasma power. As described above, FIGS. 5A and 5B show power graphs depicting different levels of plasma power coupled to a process chamber in accordance with embodiments of the invention. In one example the first and second levels of plasma power can monotonically increase or decrease during deposition of a metal silicon nitride film that contains multiple metal layers and silicon layers. In another example, the first and second levels of plasma power can have different starting levels and vary independently of each other or vary in a similar manner during deposition of the metal silicon nitride film. The first and second levels of plasma power may be selected and optimized for specific metal, silicon, and nitrogen precursors and desired film properties.

The steps 722-728 may be repeated a predetermined number of times as shown by the process flow 734 until a strained metal silicon nitride film with a desired thickness has been deposited onto the substrate. The process chamber may be purged with an inert gas, evacuated, or both purged and evacuated after each of steps 722, 724, 726, and 728.

According to one embodiment, steps 722 and 724 may be sequentially performed a first number of times as shown by the process flow 730, prior to performing steps 726 and 728.

According to another embodiment, steps 726 and 728 may be sequentially performed a second number of times as shown by the process flow 732, prior to repeating steps 722 and 724 in the process flow 734.

According to yet another embodiment, steps 722 and 724 may be sequentially performed a first number of times prior to performing steps 726 and 728 as shown by the process flow 730, and steps 726 and 728 may be sequentially performed a second number of times as shown by the process flow 732, prior to repeating steps 722 and 724 in the process flow 734.

According to one embodiment, the first number of times may decrease monotonically and the second number of times may increase monotonically each time process flow 734 is performed. In one example, in step 722, the substrate is exposed to a gas pulse containing a metal precursor, in step 724, the substrate is exposed to a gas pulse containing a nitrogen precursor activated by a plasma source at a first level of plasma power, and steps 722 and 724 are repeated twice using the process flow 730. Thereafter, in step 726, the substrate is exposed to a gas pulse containing a silicon precursor, and in step 728, the substrate is exposed to a gas pulse containing the nitrogen precursor activated by the plasma source at a second level of plasma power. Next, in step 722, the substrate is exposed to a gas pulse containing the precursor, in step 724, the substrate is exposed to a gas pulse containing the nitrogen precursor activated by the plasma source at the first level of plasma power, and steps 722 and 724 are repeated once using the process flow 730. Thereafter, in step 726, the substrate is exposed to a gas pulse containing the silicon precursor, in step 728, the substrate is exposed to a gas pulse containing the nitrogen precursor activated by the plasma source at a first level of plasma power, and steps 726 and 728 are repeated once using the process flow 732. Next, in step 722, the substrate is exposed to a gas pulse containing the metal precursor, and in step 724, the substrate is exposed to a gas pulse containing the nitrogen precursor activated by the plasma source at the first level of plasma power. Thereafter, in step 726, the substrate is exposed to a gas pulse containing the silicon precursor, in step 728, the substrate is exposed to a gas pulse containing the nitrogen precursor activated by the plasma source at the second level of plasma power, and steps 726 and 728 are repeated twice using process flow 732. In this example, the first number of times decreases from 3 to 2 to 1 and the second number of times increases from 1 to 2 to 3 during deposition of the strained metal silicon nitride film. In one example, the nitrogen precursor can be selected from $NH_3$ and $N_2H_4$.

Still referring to FIG. 7B, according to one embodiment of the invention, the gas pulse in step 724 may further comprise a dilution gas in a first ratio with the nitrogen precursor, and step 728 may further comprise the dilution gas in a second ratio with the nitrogen precursor, where the second ratio is different from the first ratio. The addition of a dilution gas to a nitrogen precursor can affect the plasma density in the process chamber and thus the amount of activated nitrogen precursor available to interact with the metal precursor. The dilution gas may be selected from He, Ar, Ne, Kr, Xe, $H_2$, or $N_2$, or a combination of two or more thereof. The first ratio may, for example, be defined as D/N or D/(D+N), where D and N refer to the amounts of the dilution gas and the nitrogen precursor, respectively. According to one embodiment, the first ratio may be varied from ratio corresponding to a substantially pure nitrogen precursor, to another ratio corresponding to a combination of the dilution gas and the nitrogen precursor, to yet another ratio corresponding to substantially pure dilution gas. In one example, a ratio D/(D+N) may increase monotonically as 0, 0.05, 0.10, . . . , 0.90, 0.95, and 1.0, during deposition of the metal silicon nitride film.

Figure 7C:
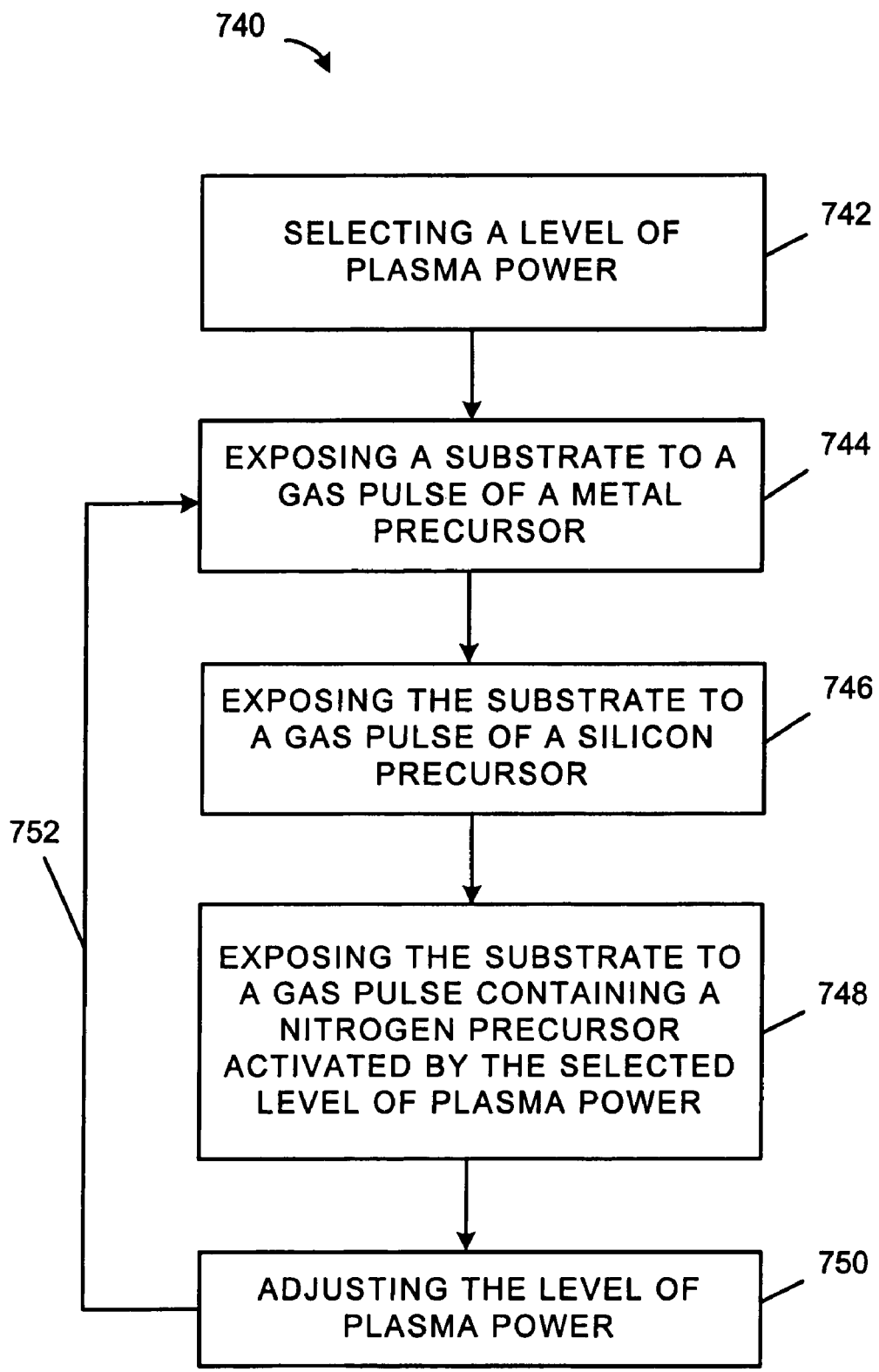

FIG. 7C is a process flow diagram for forming a strained metal silicon nitride film according to another embodiment of the present invention. The process 740 includes, in step 742, selecting a level of plasma power. The level of plasma power can range from a first level at or below a lower limit for plasma formation to a second level of plasma power corresponding to a maximum desired level of plasma power. Thus, the first level of plasma power can be 0 W of plasma power. In step 744, the substrate is exposed to a gas pulse containing a metal precursor, in step 746, the substrate is exposed to a gas pulse containing a silicon precursor, and in step 748, the substrate is exposed to a gas pulse containing a nitrogen precursor activated by the plasma source at the selected level of plasma power. In step 750, the level of plasma power is adjusted, and step 744 is repeated as shown by the process flow 752. According to one embodiment, the level of plasma power can monotonically increase or decrease during deposition of the metal silicon nitride film. The process 740 may be performed as a pulsed PECVD process that includes interrupted gas exposures of a metal precursor, a silicon precursor, and a plasma activated nitrogen precursor with at least partial temporal overlap of the gas pulses in steps 744, 746, and 748. Alternately, the process 740 may be performed as a PEALD process with no overlap of the gas pulses in steps 744, 746, and 748.

Still referring to FIG. 7C, according to one embodiment of the invention, the gas pulse in step 748 may further comprise a dilution gas in a first ratio with the nitrogen precursor, and step 750 may further comprise adjusting the amount of dilution gas from the first ratio to a second ratio different from the first ratio.

Figure 7D:
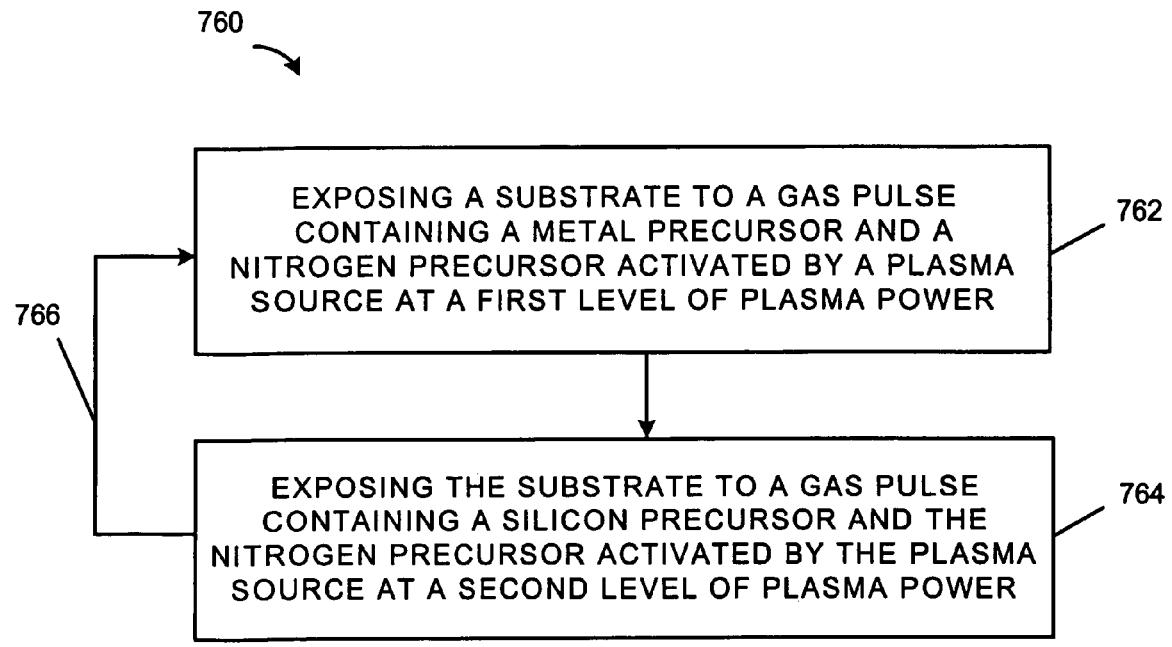

FIG. 7D is a process flow diagram for forming a strained metal silicon nitride film according to another embodiment of the invention. The process 760 includes, in step 762, exposing a substrate to a gas pulse containing a metal precursor, a silicon precursor, and a nitrogen precursor activated by a plasma source at a first level of plasma power. In step 764, the substrate is exposed to a gas pulse containing the metal precursor, the silicon precursor and the nitrogen precursor activated by the plasma source at a second level of plasma power different from the first level of plasma power. According to one embodiment of the invention, the gas pulse in step 762 may further comprise a dilution gas in a first ratio with the nitrogen precursor and step 764 may further comprise the dilution gas in a second ratio with the nitrogen precursor, where the second ratio is different from the first ratio.

Figure 7E:
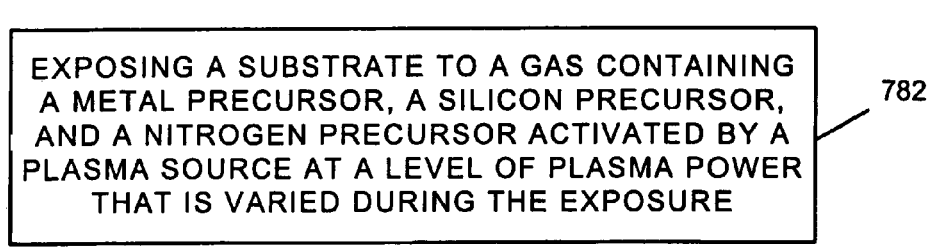

FIG. 7E is a process flow diagram for forming a strained metal silicon nitride film according to another embodiment of the present invention. The process 780 includes, in step 782, exposing a substrate to a gas containing a metal precursor, a silicon precursor, and a nitrogen precursor activated by a plasma source at a level of plasma power that is varied during the exposure. In one example the level of plasma power can monotonically increase or decrease during deposition of the metal silicon nitride film. According to one embodiment of the invention, the gas pulse in step 782 may further comprises a dilution gas in a ratio with the nitrogen precursor where the ratio is varied during the exposure. In one example the ratio can monotonically increase or decrease during deposition of the metal silicon nitride film.

While the invention has been illustrated by the description of several embodiments thereof, and while the embodiments have been described in considerable detail, they are not intended to restrict or in any way limit the scope of the appended Claims to such detail. Additional advantages and modifications will readily appear to those skilled in the art. The invention in its broader aspects is therefore not limited to the specific details, representative systems and method and illustrative examples shown and described. Thus, different aspects of the embodiments disclosed herein may be used in combination. For example, a metal nitride and a metal silicon nitride can alternately be formed in the same deposition process, plasma and non-plasma steps can be included in the deposition process etc. Accordingly, departures may be made from such details without departing from the scope of the general inventive concept.

What is claimed is:

1. A method of depositing a strained metal silicon nitride film on a substrate in a process chamber, comprising:
   exposing the substrate to a gas comprising a metal precursor;
   exposing the substrate to a gas comprising a silicon precursor;
   exposing the substrate to a gas comprising a nitrogen precursor activated by a plasma source at a first level of plasma power and configured to react with the metal precursor or the silicon precursor with a first reactivity characteristic; and
   exposing the substrate to a gas comprising the nitrogen precursor activated by the plasma source at a second level of plasma power different from the first level and configured to react with the metal precursor or the silicon precursor with a second reactivity characteristic such that a property of the metal silicon nitride film formed on the substrate changes to provide the strained metal silicon nitride film, wherein the exposing the substrate to a gas comprising a nitrogen precursor activated by a plasma source at a first level of plasma power further comprises providing a dilution gas in a first dilution ratio with the nitrogen precursor, and wherein the exposing the substrate to a gas comprising the nitrogen precursor activated by the plasma source at a second level of plasma power further comprises providing the dilution gas in a second dilution ratio with the nitrogen precursor different from the first dilution ratio.

2. The method of claim 1, comprising:
   a) exposing the substrate to a gas pulse comprising the metal precursor;
   b) exposing the substrate to a gas pulse comprising the nitrogen precursor activated by the plasma source at the first level of plasma power;
   c) exposing the substrate to a gas pulse comprising the silicon precursor;
   d) exposing the substrate to a gas pulse comprising the nitrogen precursor activated by the plasma source at the second level of plasma power; and
   e) repeating steps a) - d) a predetermined number of times.

3. The method of claim 2, further comprising sequentially performing steps a) and b) a first number of times prior to performing steps c) and d).

4. The method of claim 2, further comprising sequentially performing steps c) and d) a second number of times prior to repeating steps a) and b) in step e).

5. The method of claim 2, further comprising sequentially performing steps a) and b) a first number of times prior to performing steps c) and d), and sequentially performing steps c) and d) a second number of times prior to repeating steps a) and b) in step e).

6. The method of claim 2, wherein the first level of plasma power or the second level of plasma power, or both first and second levels of plasma power, are varied during deposition of strained metal silicon nitride film.

7. The method of claim 6, wherein the first and second levels of plasma power are between a first value of plasma power at or below a lower limit for plasma formation and a second value of plasma power corresponding to a maximum desired plasma power.

8. The method of claim 2, further comprising purging or evacuating, or both purging and evacuating the process chamber after each of steps a)-d).

9. The method of claim 2, wherein steps a) and b) have at least partial temporal overlap.

10. The method of claim 2, wherein steps c) and d) have at least partial temporal overlap.

11. The method of claim 2, wherein steps a) and b) have at least partial temporal overlap and steps c) and d) have at least partial temporal overlap.

12. The method of claim 1, wherein the metal precursor comprises elements selected from alkaline earth elements, rare earth elements, Group III, Group IIIB, Group IVB, Group VB, and Group VIB of the Periodic Table, or a combination of two or more thereof.

13. The method of claim 1, wherein the nitrogen precursor is selected from $N_2$, $NH_3$, $N_2H_4$, and $C_1$-$C_{10}$ alkyl hydrazine compounds.

14. The method of claim 1, wherein the silicon precursor comprises silane ($SiH_4$), disilane ($Si_2H_6$), monochlorosilane ($SiClH_3$), dichlorosilane ($SiH_2Cl_2$), trichlorosilane ($SiHCl_3$), hexachlorodisilane ($Si_2Cl_6$), diethylsilane, alkylaminosilane compounds, or a combination of two or more thereof.

15. The method of claim 14, wherein the alkylaminosilane comprises di-isopropylaminosilane, bis(tert-butylamino)silane, tetrakis(dimethylamino)silane, tetrakis(ethylmethylamino)silane, tetrakis(diethylamino)silane, tris(dimethylamino)silane, tris(ethylmethylamino)silane, tris(diethylamino)silane, or tris(dimethylhydrazino)silane, or a combination of two or more thereof.

16. The method of claim 1, wherein the dilution gas is selected from He, Ar, Ne, Kr, Xe, $H_2$, or $N_2$, or a combination of two or more thereof.

17. The method of claim 1, wherein the first and second levels of plasma power are between a first value of plasma power at or below a lower limit for plasma formation and a second value of plasma power corresponding to a maximum desired plasma power.

18. The method of claim 1, comprising:
exposing the substrate to a first gas pulse comprising the metal precursor and the nitrogen precursor activated by the plasma source at the first level of plasma power; and
exposing the substrate to a second gas pulse comprising the silicon precursor and the nitrogen precursor activated by the plasma source at the second level of plasma power, wherein the first level or the second level, or both the first and second levels are varied during the deposition of the strained metal silicon nitride film.

19. The method of claim 18, wherein the first gas pulse further comprises a silicon precursor and the second gas pulse further comprises a metal precursor.

20. The method of claim 1, wherein the first level or the second level, or both the first and second levels, are varied monotonically.

21. The method of claim 1, wherein the exposing steps have at least partial temporal overlap.

* * * * *